United States Patent [19]

Sugai et al.

[11] Patent Number: 5,028,101

[45] Date of Patent: Jul. 2, 1991

[54] SURFACE-ACOUSTIC-WAVE DEVICE AND NOTCH FILTER DEVICE HAVING A PLURALITY OF DIODE ARRAY CHANNELS

[75] Inventors: Kazuyoshi Sugai; Osamu Noguchi, both of Tokyo, Japan

[73] Assignee: Clarion Co., Ltd., Tokyo, Japan

[21] Appl. No.: 381,121

[22] Filed: Jul. 14, 1989

[30] Foreign Application Priority Data

Jul. 19, 1988 [JP] Japan .................................. 63-180822
Nov. 4, 1988 [JP] Japan .................................. 63-278769
Nov. 11, 1988 [JP] Japan .................................. 63-284884

[51] Int. Cl.$^5$ .............................................. H03H 9/64
[52] U.S. Cl. .................................. 333/193; 310/313 R; 333/195
[58] Field of Search ................................ 333/150–154, 333/193–196; 310/313 R, 313 A, 313 B, 313 C, 313 D; 364/821

[56] References Cited

U.S. PATENT DOCUMENTS

| 4,037,174 | 7/1977 | Moore et al. | 333/193 |
| 4,066,984 | 1/1978 | Stern et al. | 333/151 |
| 4,458,328 | 7/1984 | Kino et al. | 333/150 X |
| 4,683,395 | 7/1987 | Mitsutsuka | 333/152 X |
| 4,697,115 | 9/1987 | Mitsutsuka | 333/150 X |

FOREIGN PATENT DOCUMENTS 2711460 10/1977 Fed. Rep. of Germany ...... 333/150
1569362 3/1977 United Kingdom .

Primary Examiner—Benny Lee
Attorney, Agent, or Firm—Flynn, Thiel, Boutell & Tanis

[57] ABSTRACT

A SAW device uses an input and output transducers having different electrode periods, and includes diode arrays provided in a semiconductor layer under a gate electrode between both transducers, so that the device has an excellent efficiency as a notch filter.

24 Claims, 20 Drawing Sheets

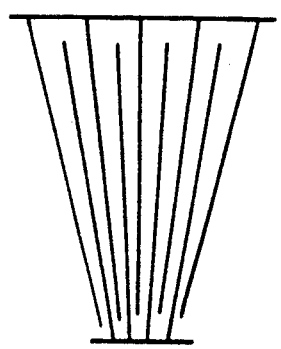
FIG. 2A
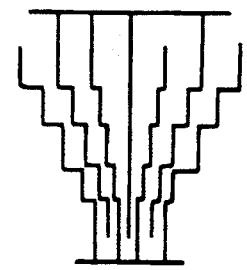
FIG. 2B
FIG. 4A
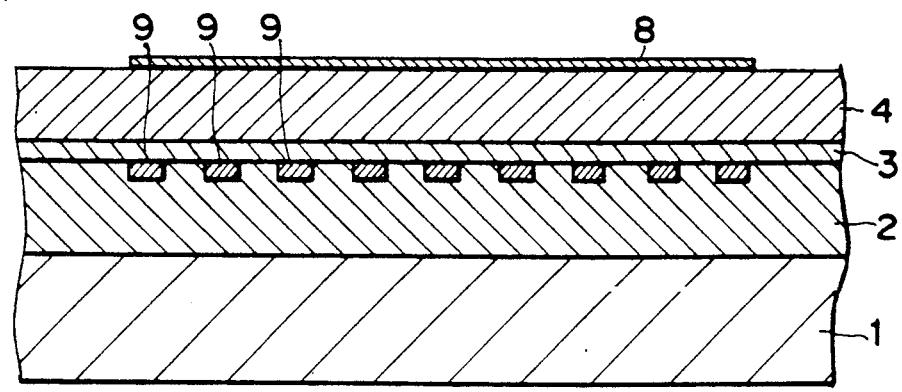
FIG. 4B
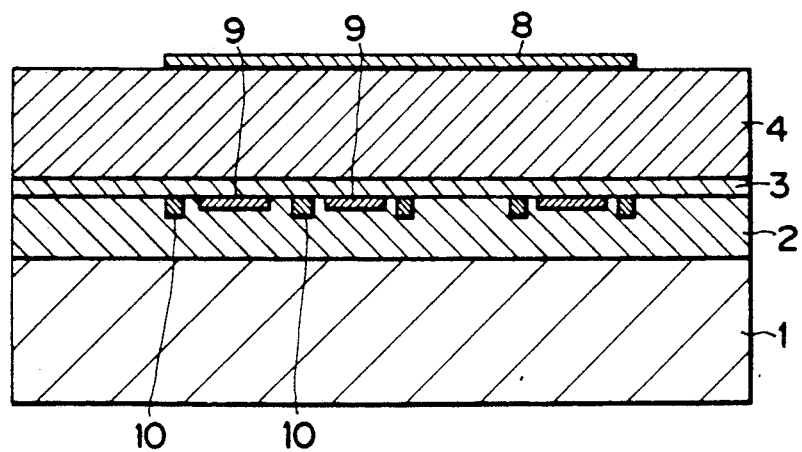

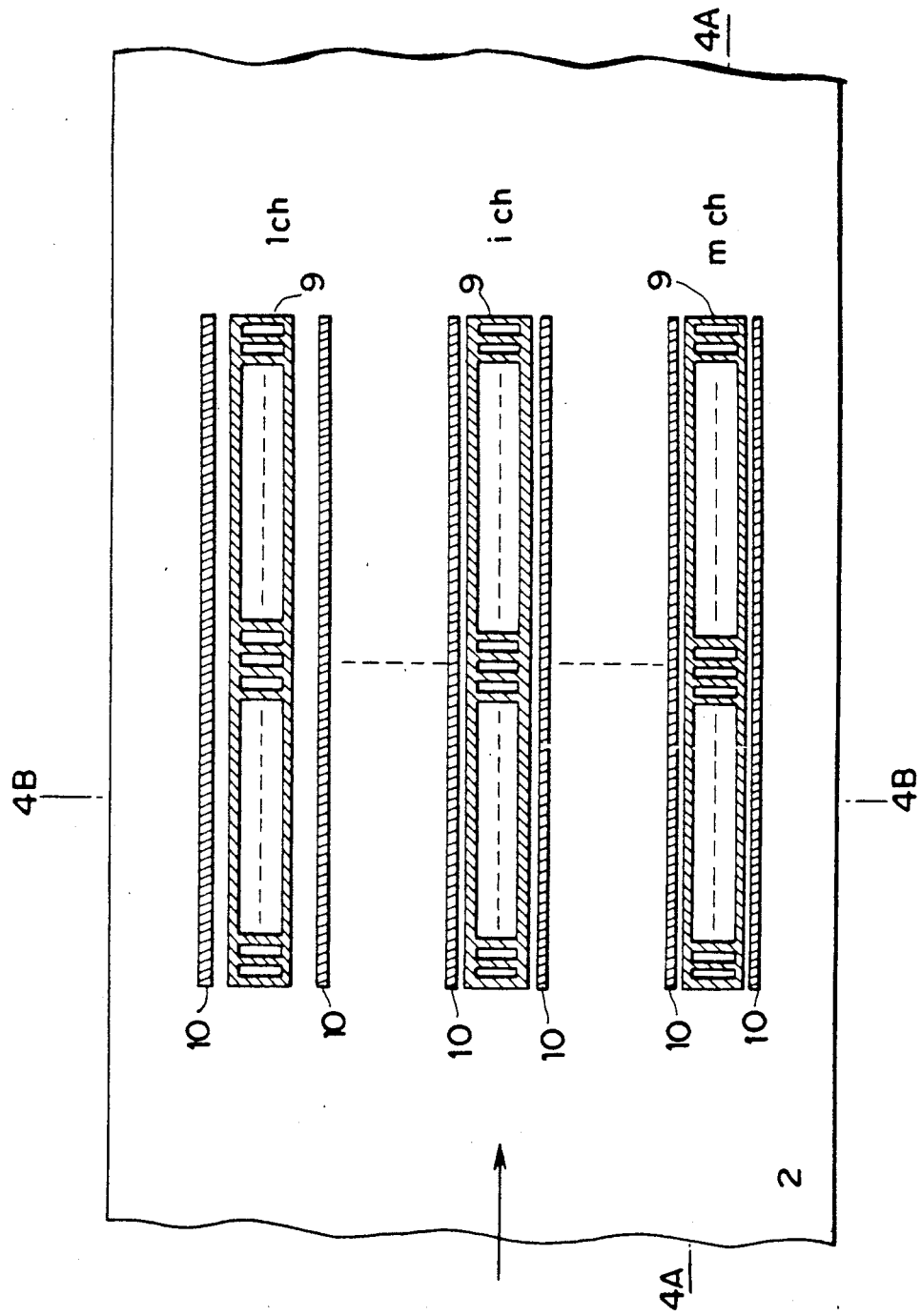

$f_1 < f_2 < \cdots < f_i < \cdots < f_m$

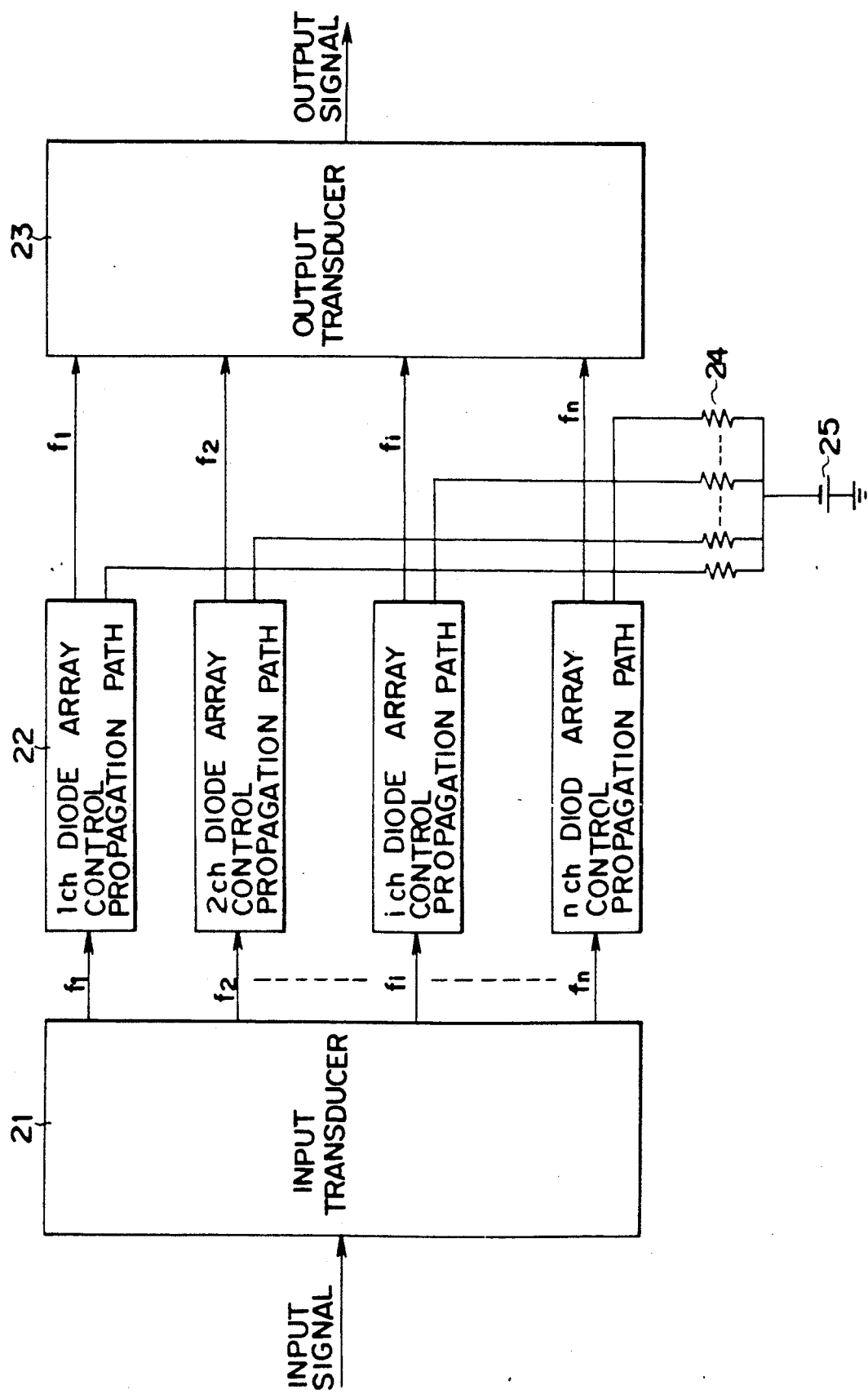

SURFACE-ACOUSTIC-WAVE DEVICE AND NOTCH FILTER DEVICE HAVING A PLURALITY OF DIODE ARRAY CHANNELS

FIELD OF THE INVENTION

This invention relates to a surface-acoustic-wave device (hereinafter called "SAW device") and a notch filter device used in a spread-spectrum communication system.

BACKGROUND OF THE INVENTION

One of problems involved in a spread-spectrum communication system of a direct spreading (DS) system is high-level CM jamming or interference which often disables communication. In order to overcome the problem, various filters using a SAW are proposed. Some typical examples are as follows:

(i) CW interference is suppressed by an adapting processing using a programmable transversal filter (C. M. Panasik 1982 Ultrasonics Symp. Proc. pp 100–103)

(ii) A chirp filter performs Fourier transform to suppress interfering signal components by controls through an RF switch or by combination of cutting and removing functions, and a chirp filter performs reverse Fourier transform. A convolver is used for subsequent processings subsequent to the reverse Fourier transform, thereby to simplify the system. (J. Gevargiz et al., 1985 Ultrasonics Symp. Proc. pp 108–113)

(iii) An input signal is spacially distributed depending on frequencies, using an inclined chirp transducer as an input transducer, so as to suppress CW interference, using an elastic nonlinearity in a region where a high level signal component propagates. (M. F. Lewis, *ELECTRONICS LETTERS* 21, 1985, pp 573–574)

These filters, however, involve the following drawbacks:

In the filter of (i) above, since the impulse response of the transversal filter is controlled by controlling the weighting of respective taps, it substantially behaves as a transversal notch filter. Therefore, it is difficult to obtain a narrow-band notch characteristic, and the filter undesirably suppresses relatively wide frequency components near the CW interference.

In the filter of (ii) above requiring Fourier transform and reverse Fourier transform, its signal processing is complicated.

In the filter of (iii) above, the use of the elastic nonlinearity requires significantly large power for the input.

OBJECT OF THE INVENTION

It is therefore an object of the invention to provide a SAW device and a notch filter device which perform CW interference suppression useful in a direct spreading type spread-spectrum communication receiver to ensure highly quality filtering and simplification of the system.

SUMMARY OF THE INVENTION

According to the invention, there is provided a surface-acoustic-wave device comprising a first conduction type semiconductor layer; a piezoelectric layer provided on said first conduction type semiconductor layer; an input transducer and an output transducer provided on said piezoelectric layer in a direction across a traveling direction of a surface acoustic wave and having different electrode periods; a gate electrode provided on said piezoelectric layer between both said transducers; and diode means provided in said traveling direction in said first conduction type semiconductor layer under said gate electrode.

The principle of the operation of the device having the aforementioned structure is the use of an electroacoustic interaction between a SAW and a carrier or charge in a semiconductor to positively use the nature that the attenuation amount attendant on SAW propagation is changed largely with the semiconductor surface condition.

BRIEF DESCRIPTION OF THE DRAWINGS

FIGS. 2(a), and 2(b) are schematic upper views of input and output transducers;

FIG. 3 is a plan view of the surface of a p(n)-type Si epitaxial layer under a gate electrode;

FIGS. 4(a) and 4(b) are cross-sectional views of the element along the A—A' line and the B—B' line of FIG. 3;

FIG. 11 is a schematic view of an adaptive notch filter;

DETAILED DESCRIPTION OF THE INVENTION

Figure 1A:
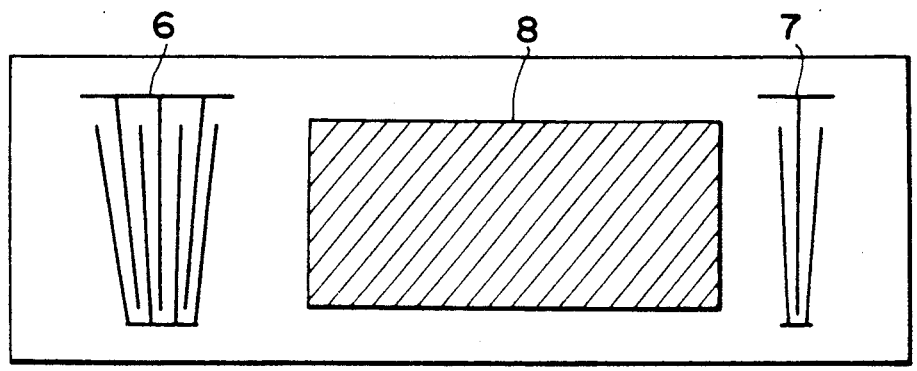
FIG. 1(a) is an upper view of a SAW device according to the invention.

The invention is described below in detail, referring to preferred embodiments illustrated in the drawings. They are not but examples, and the invention involves various modifications and improvements without departing the scope thereof.

FIGS. 1 through 10 are used, in particular, for explanation of embodiments corresponding to claims 1 to 8.

Figure 1B:
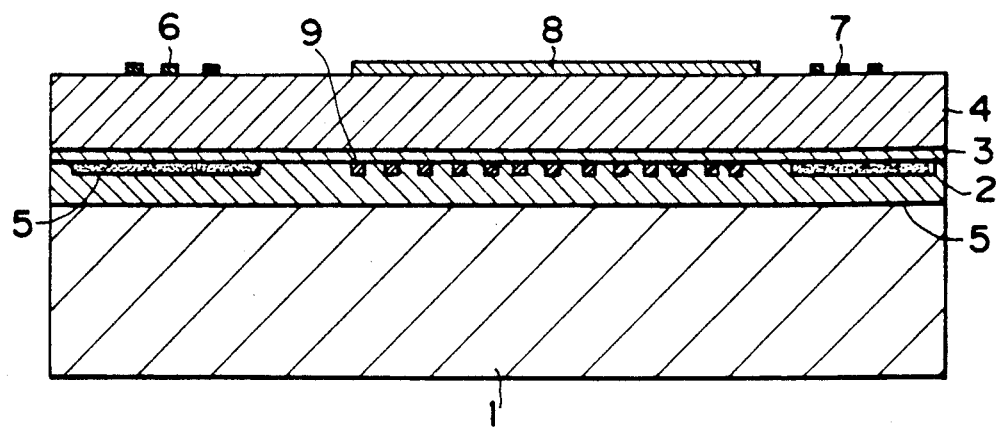
FIG. 1(b) is a cross-sectional view of the same SAW device.

FIGS. 1(a) and 1(b) are upper and cross-sectional views of an inventive SAW device. Reference numeral 1 denotes a $p^+(n^+)$-Si single-crystal substrate on which a p(n)-Si epitaxial layer 2 having a low impurity density is provided.

Reference numeral 3 designates a thermal oxide layer provided on the p(n)-type epitaxial layer. Numeral 4 refers to a ZnO piezoelectric layer provided on the thermal oxide layer 3. Numerals 6, 7 and 8 indicate metal layers provided on the ZnO layer 4 to respectively behave as an input transducer, an output transducer and a DC bias applying gate electrode.

Numeral 5 indicates a $p^+(n^+)$ diffused region provided under the input and output transducers 6 and 7 to improve the SAW conversion efficiency of these transducers. The transducers 6 and 7 are not of a regular type, but their electrode periods are changed in a direction across the SAW traveling direction (on the surface of the propagation path. They are in general arranged as shown in FIGS. 2(a) and 2(b).

Electrode fingers extend angularly in FIG. (a) and they extend in a dog-leg configuration in FIG. 2(b). In both arrangements, the electrode pitch is constant in any selected SAW propagating path. By using such transducers as input and output transducers, propagation paths are different spacially according to the frequency of a SAW. In other words, spacial Fourier transform is performed.

Under the gate electrode 8 are provided arrays of diodes by diffusing an impurity. FIG. 3 is a plan view of the diodes arrays. FIG. 3 is a plan view of the surface of the p(n)-Si epitaxial layer 2 under the gate electrode, and an arrow indicates the SAW traveling direction. The surface of the p(n) type epitaxial layer 2 is divided across the SAW traveling direction into m pieces of regions. The propagation path is also divided similarly into m pieces. When each such region is referred to as a channel, a stair-shaped $n^+(p^+)$ type diffused region 9 is formed in each channel. Then $n^+(p^+)$ type diffused region 9 and the p(n) type epitaxial layer 2 form pn diodes. The $n^+(p^+)$ diffused region 9 may be in the form of comb teeth in lieu of stairs, provided that diodes are aligned at intervals in each channel and are connected to each other. Numeral 10 denotes a $p^+(n^+)$-type channel stop diffused region which behave as an isolator to isolate each channel from other channels.

FIGS. 4(a) and 4(b) are cross-sectional views of the device element taken along A—A' line and B—B' line of FIG. 3.

FIG. 4(a) is a cross-sectional view of the element whose sectional surface extend along the SAW traveling direction and shows the $n^+(p^+)$-type diffused region 9, i.e. an array of connected diodes, is provided along a channel of the p(n) type epitaxial layer 2 under the gate electrode 8.

FIG. 4(b) is a cross-sectional view of the element whose sectional surface extend across the SAW traveling direction and shows that the diode arrays of respective channels are aligned on the surface of the p(n) type epitaxial layer 2 under the gate electrode 8 and are isolated for every channel by the $p^+(n^+)$ channel stop diffused regions 10.

Figure 5:
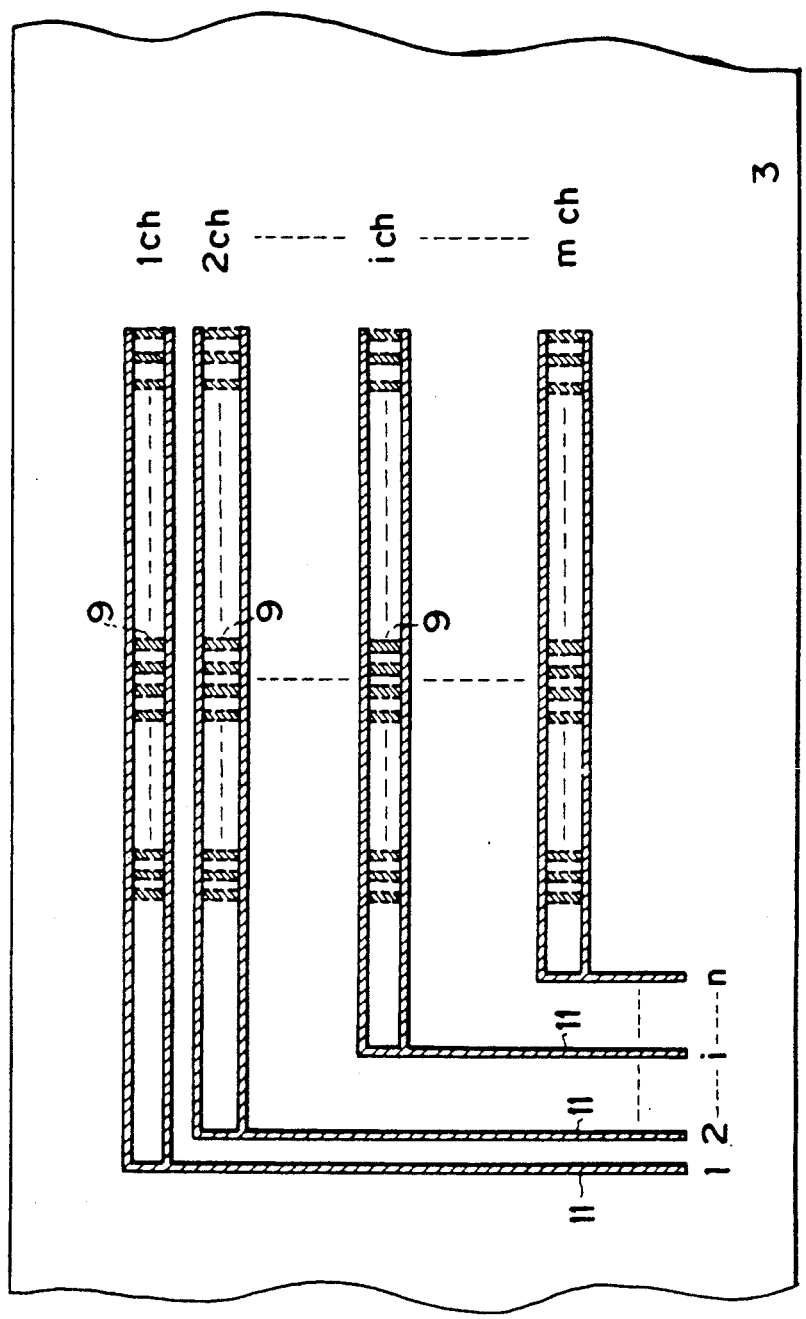
FIG. 5 is a plan view of metal lines provided on the surface of the p(n)-type epitaxial layer to control pn diodes.

FIG. 5 shows metal lines provided on the surface of the p(n) type epitaxial layer 2 to control the pn diodes. In FIG. 5, reference numeral 11 denotes metal lines provided on the silicon oxide layer 3.

The metal lines 11 are independent for every channel, and are connected to the $p^+(n^+)$ type diffused region 5 through contact holes provided in the thermal oxide layer 3. The metal lines 11 are extended to the exterior from the propagation path and form respective bonding pads. The ZnO layer 4 is selectively removed above the pads by etching to permit the pads to be bonded.

The above-explained embodiment operates as described below.

Figure 6:
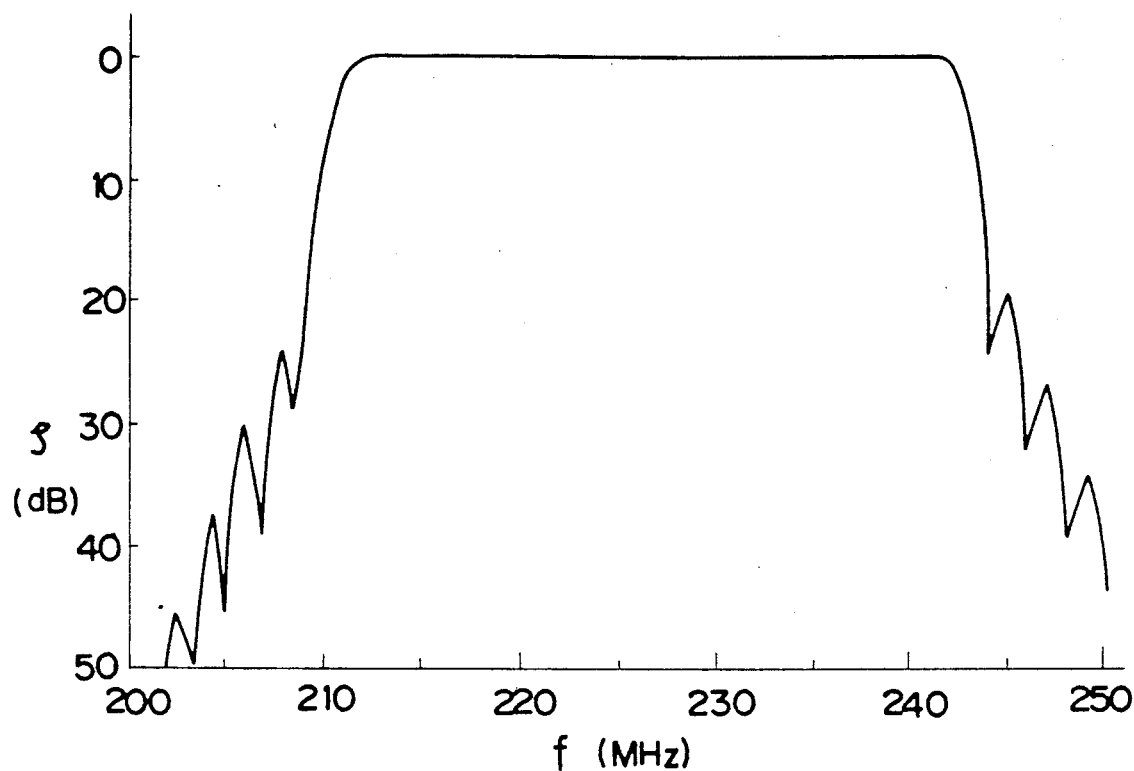
FIG. 6 is a graph showing an essential band filter characteristic of an inventive filter.

The input and output transducers 6 and 7 (FIGS. 1A and 1B) have inclined electrode fingers in which the electrode interval (corresponding to the wavelength of a SAW) is 20 μm to 28 μm, the interdigitating width (W) is 4 mm, and the number of electrode pairs is 103 in the input side and 12 in the output side. The substrate is Si(110)-cut, in the form of $p/p^+$ structure, and the SAW propagating direction is Si[100]. The thickness of the p-type Si epitaxial layer 2 is about 3 μm, and the impurity density is about $5.0 \times 10^{14} cm^{-3}$. The thickness of the thermal oxide layer 3 is 100 nm, and the thickness of the ZnO piezoelectric layer 4 is about 5 μm. The P-doped $n^+$ diffused region 9 is provided on the surface of the p-type Si epitaxial layer 2 to form the diodes, and the respective channels are separated by channel stoppers in the form $p^+$ type diffused regions 10 (FIG. 3) doped with B. The transducers 6 and 7 on the ZnO layer 4, gate 8 and diode control lines 11 (FIG. 5) connected to the diodes are made from Al, FIG. 6 shows the essential band pass filtering characteristic of the inventive filter. In the drawing, f designates the frequency, and p indicates the insertion loss. Since the input transducer of this filter consists of inclined electrode fingers, it is considered that different frequency components travel along different portions of the SAW propagation path.

Figure 7:
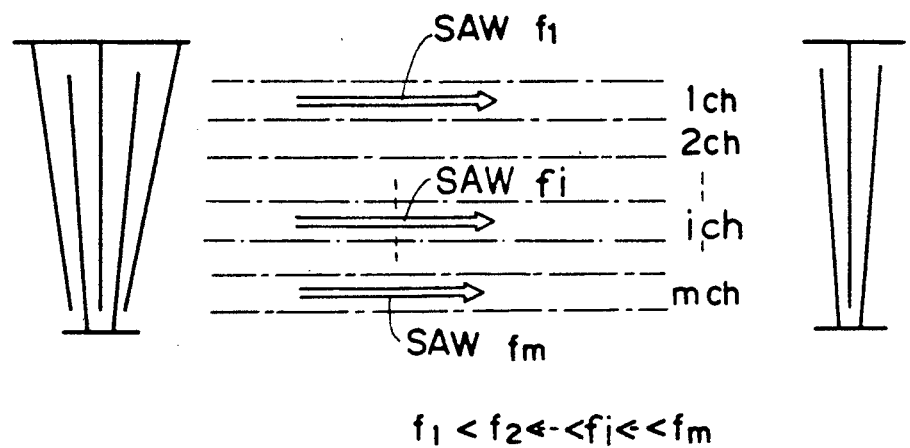
FIG. 7 is a schematic view for explaining channel division.

As shown in FIG. 7, the SAW propagating path is divided into channels for respective frequency components. Even if the attenuation amount attendant on propagation of a SAW increases in a certain channel i alone, signals of a frequency component f are attenuated in the i channel alone, with no influence to frequency components of other channels, so that a notch characteristic is added to the band pass filtering characteristic as shown in FIG. 6.

Figure 8:
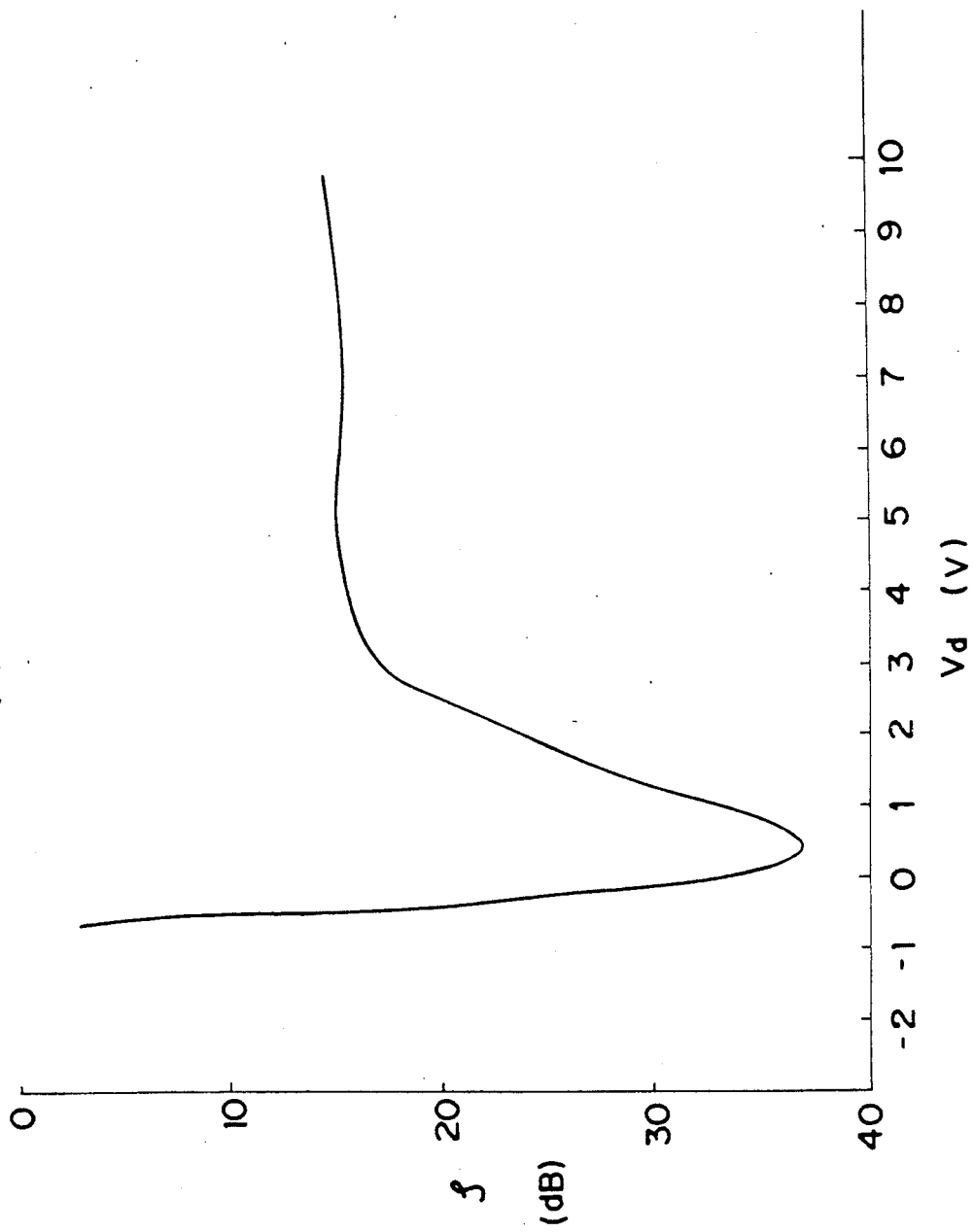
FIG. 8 is a graph showing the relationship between the insertion loss and the bias voltage.

The notch characteristic of each channel is controlled by the gate electrode 8 and by a d.c. bias voltage $V_d$ applied to the metal line 11 connected to the diode array of the channel. FIG. 8 shows the relationship between the insertion loss $\rho$ and the bias voltage when CW is inputted in the above-described device.

Here the size of the gate electrode 8 is 10 mm ×4 mm, and the number of channels is 20. Assuming that the gate electrode voltage $V_g$ is fixed at +2 V, the SAW attenuation amount changes with the diode voltage $V_d$. $V_d$ smaller than zero ($V_d<0$) is a forward voltage, and $V_d$ larger than zero ($V_d>0$) is a reverse voltage.

Under $V_g=+2$ V and $V_d$ (diode voltage) =0, the depletion layer expands with an increase in $V_g$ in a region other than the depletion layer produced near the diodes, and minority carriers begin to accumulate along the surface. The minority carriers whose density is not so large in this condition interact with a SAW and attenuate the SAW largely. On the other hand, when the diode voltage $V_d$ is biased forwardly, a forward current flows, and the SAW attenuation is minimized. This decrease is used to form a programmable notch filter.

In the programmable notch filter, a certain degree of inverted condition is normally held by a gate bias and diodes are biased forwardly, in order to minimize the SAW propagation loss in each channel. When a high level CW interference is found in the band by monitoring the input signal, diodes in the channel corresponding to the output signal component are controlled to zero volt or to a reverse bias. Accordingly, the power of the SAW traveling in the channel is largely attenuated, and the notch characteristic is obtained.

Figure 9:
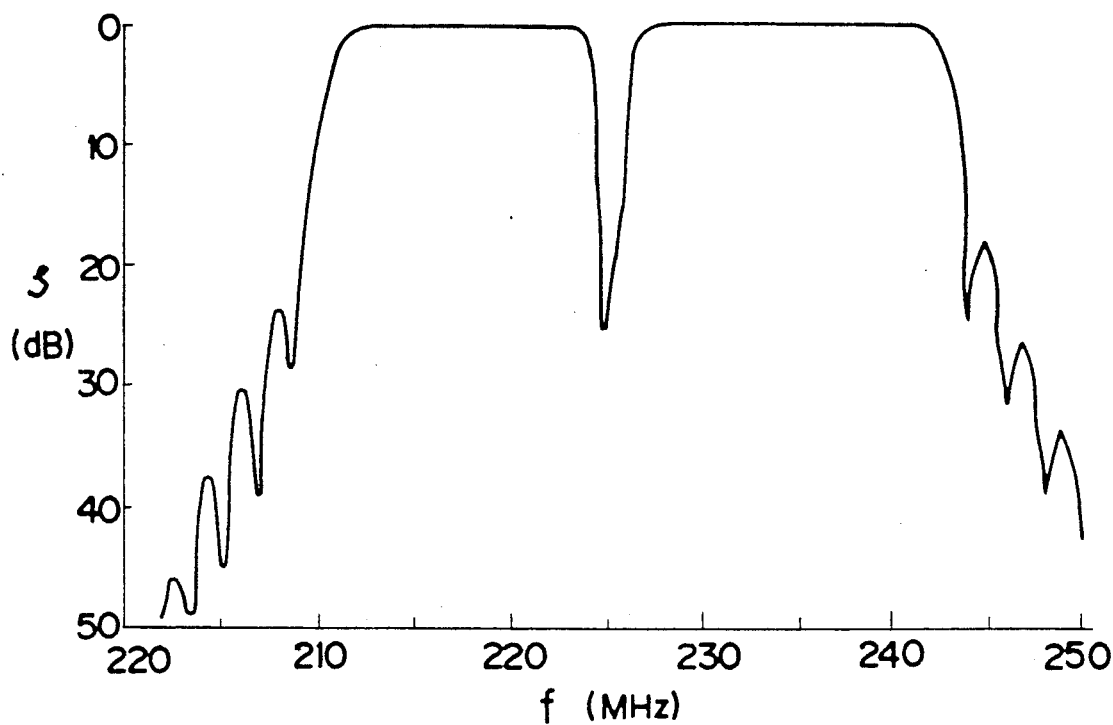
FIG. 9 is a graph showing the relationship between the insertion loss and the frequency.
Figure 10:
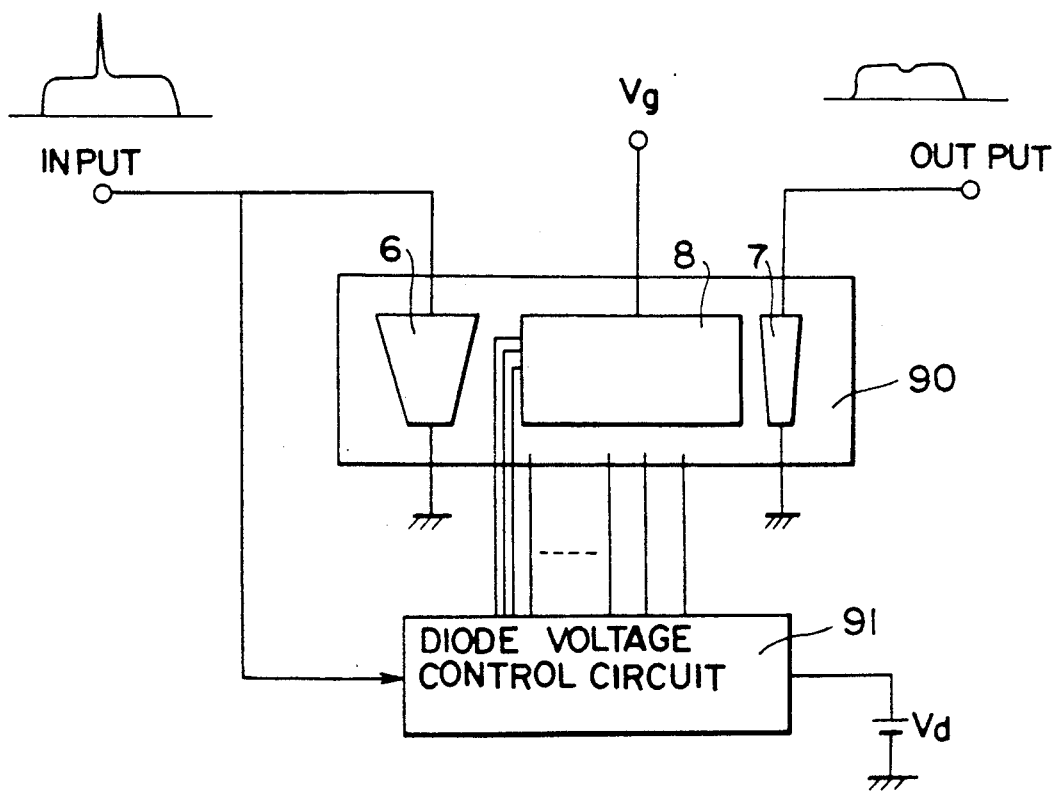
FIG. 10 is a schematic view showing an arrangement of a notch filter system.

FIG. 9 is a graph of the relationship of insertion loss and frequency, and thus shows the notch characteristic under zero voltage of the diodes in the tenth channel. FIG. 10 shows an arrangement of the notch filter system including at 90 a SAW device which is the inventive SAW device (for example as shown in FIGS. 1A and 1B), and a separate control circuit 91 which controls the diode bias voltages in the manner described in the preceding paragraph.

In order to obtain an excellent notch characteristic of the notch filter, it is important to increase the number of pairs of the input transducer electrode fingers. Namely, in order to obtain a spacial frequency resolving power, an increased number of pairs more than 50 pairs is normally required. When inclined electrode fingers are used, an increase of the number of pairs does not invite a large secondary effect caused by reflection by the electrode ends. Further, a relatively small number of pairs is acceptable at the output side.

Figure 12A:
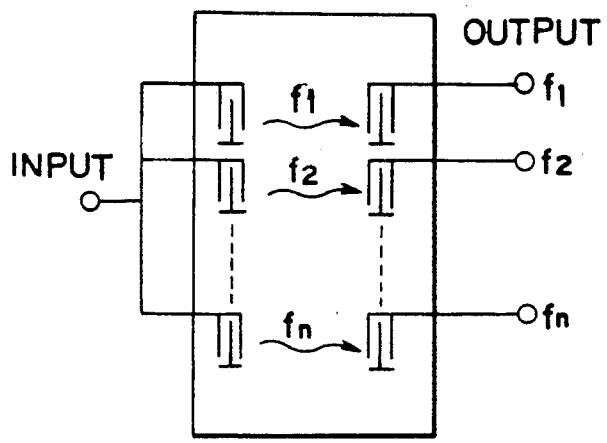
FIGS. 12(a), 12(b), 12(c) and 12(d) are plan views showing different arrangements of an input transducers.
Figure 12B:
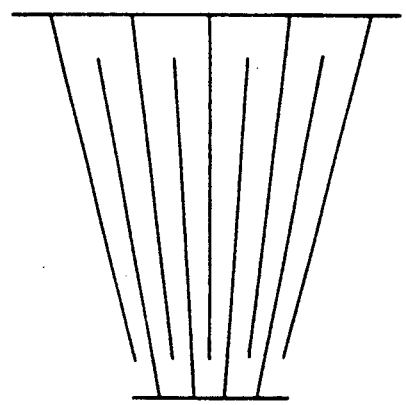
Figure 12C:
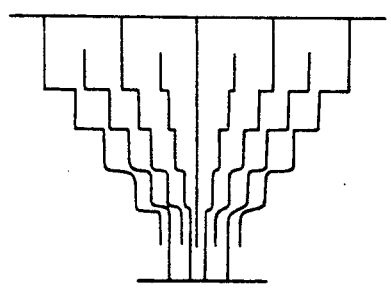

FIG. 11 is a schematic view of an adaptive notch filter taken as an example of the embodiments. Assume here that the input signal involves a high level narrow-band signal mixed in a wide-band spread signal. The input signal is entered in an input transducer 21 and is divided for different propagation tracks 1 ch through n ch having center frequencies $f_l$ to $f_n$, depending to respective frequency components of the signal. Each propagation track is called "channel" here. The input transducer may be a filter bank (see FIG. 12(a)) or may be one of a transducer having inclined electrode fingers in case of incorporation of the adaptable notch filter into the same substrate (FIG. 12(b)), a dog-leg-shaped transducer (FIG. 12(c)) and an array of transducers having different center frequencies (FIG. 12(d)). In a broad sense, all the transducer arrangements have a function of spacially classifying the input signal into respective frequency components. Each signal which has been spacially frequency-classified by the input transducer is brought to the propagation path 22 of each channel. In the propagation path are provided diodes or diode arrays which are biased by a d.c. bias source 25 via resistor arrays 24. Signals brought to respective channels are entered in the diode arrays, and a self bias caused by a nonlinear current is produced in the diodes in response to the input level. By controlling the passing characteristic of the propagation path in response to the magnitude of the self bias, input signal components only in channels including high level signal components are suppressed. After this, the signal components of the respective channels are summed in an output transducer 23 having the same characteristic as that of the input transducer, and a spread signal whose high level narrow-band signal is suppressed is outputted finally.

Figure 13A:
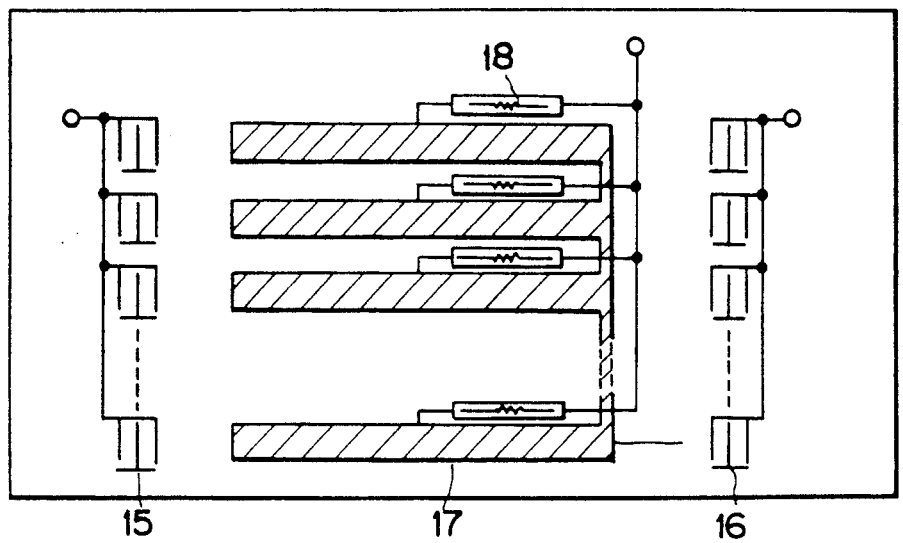
FIG. 13(a) and 13(b) are upper and cross-sectional views of a SAW device taken as a further embodiment of the invention.
Figure 13B:
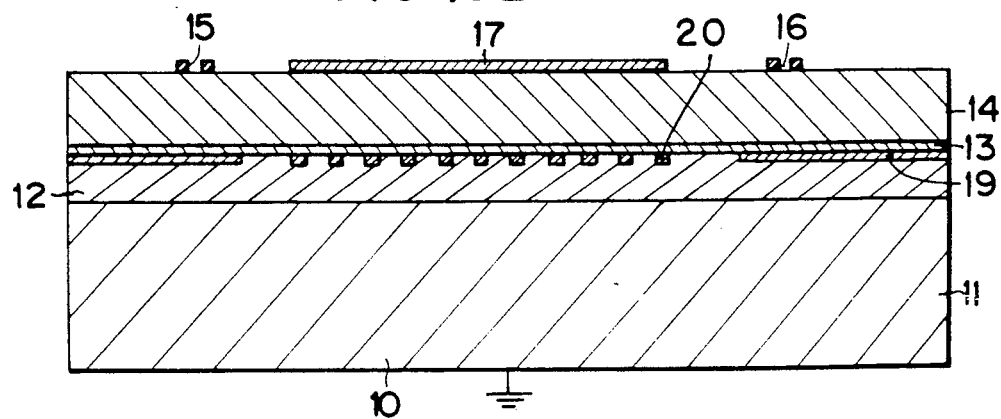
Figure 14:
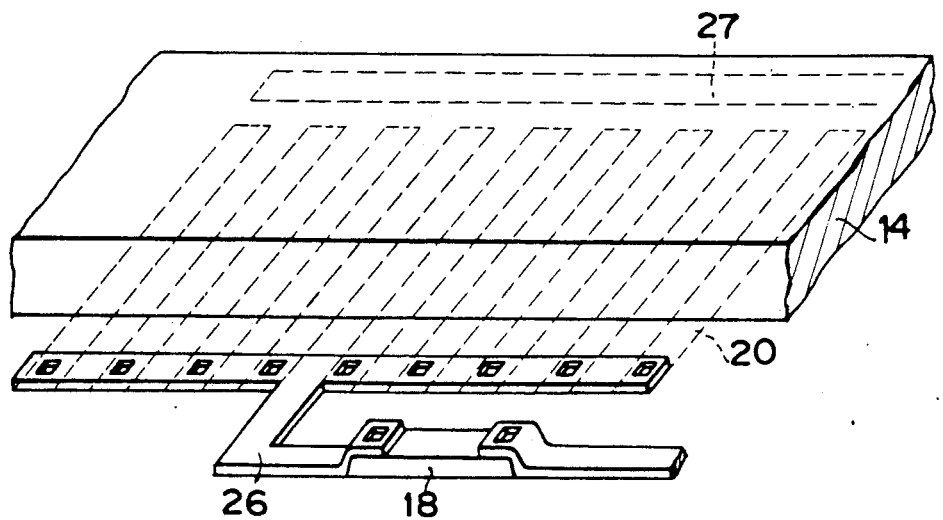
FIG. 14 is a detailed perspective view of the propagating portion of channel i in the device of FIG. 13.

FIGS. 13 and 14 show an element which realizes the concept of the adaptive notch filter of FIG. 11 using a SAW.

FIGS. 13(a) and 13(b) are schematic views of an adaptable notch filter in the form of a SAW element.

Reference numeral 11 denotes a $p^+(n^+)$-Si single-crystal substrate having thereon a p(n) type epitaxial layer 12 of a low impurity density. Numeral 13 designates a thermal oxide layer provided on the p(n) type epitaxial layer 12, and 14 denotes a ZnO piezoelectric layer provided on the thermal oxide layer 13. Numerals 15, 16 and 17 indicate a metal layer which forms an input transducer, an output transducer and a d.c. bias applying gate electrode. The transducer is in the form of transducer arrays having the configuration of the filter bank of FIG. 12(d) and having different center frequencies. Numeral 18 denotes a resistor made from polycrystalline silicon on the thermal oxide layer 13. The polycrystalline resistor is provided for each channel and inserted between the diode array in the epitaxial layer 12 and the d.c. bias source so that the bias of the diode array is controlled via the polycrystalline resistor. Numeral 19 denotes a $p^+(n^+)$ type diffused region provided under the input an output transducers 15 and 16 to improve the efficiency of the input and output transducers. Numeral 20 designates an array of n-type impurity diffused regions provided in the p(n) type Si epitaxial layer 12 to form arrays of pn diodes.

FIG. 14 shows the propagation path portion of a single channel in a greater detail.

The diode array 20 is provided in the epitaxial layer under the ZnO piezoelectric layer and is connected to a metal line 26. The metal line 26 is connected to the polycrystalline silicon resistors 18 and such metal lines from all the channels are integrally connected to the d.c. bias source. Numeral 27 denotes a $p^+(n^-)$ channel stop diffused region which behaves as an isolator for isolating the channel from other channels.

As shown in FIG. 14, the ZnO piezoelectric layer 14 is selectively removed by etching unwanted portions other than the portion above the diode array of each channel.

The propagation path of the element of FIG. 13 includes a plurality of arrangements of FIG. 14 in alignment.

The device having the above-described arrangement operates as an adaptive notch filter. Its operating principle is the use of an interaction between a SAW and a carrier in the semiconductor. Namely, it positively uses the characteristics that the SAW attenuation amount changes with the semiconductor surface condition and uses the diode self bias effect caused by a nonlinear resistance of the pn diodes.

The input and output transducers are in the form of a filter bank including parallely connected transducers having different electrode periods (corresponding to the wavelength of a SAW) (see FIG. 12($d$)). Namely, they each consists of twenty-one 21) parallel-connected transducers of the electrode period of 22 $\mu$m to 26 $\mu$m. The number of electrode pairs of the input side is two hundred (200), and that of the output side is fifteen (15). The input transducer is in the form of a thinned-out structure in order to suppress secondary effects such as SAW reflection within the electrode. The interdigitating width of the transducers is 170 $\mu$m.

The substrate is Si(110)-cut, the semiconductor layer has a p/p+ structure, and the SAW propagating direction is [100]. The thickness of the p-type Si epitaxial layer is about 10 $\mu$m, and the impurity density is about $5.0 \times 10^{11} cm^{-3}$.

The Si thermal oxide layer is about 100 nm thick, and the ZnO piezoelectric layer is about 5.0 $\mu$m thick. A P-doped n-type impurity region is provided on the surface of the p-type Si epitaxial layer to form pn diodes, and respective channels are separated by channel stops in the form of B-doped p+ diffused regions.

The transducers on the ZnO layer, gate and diode bias control lines are made from A$l$. A polycrystalline resistor of about 1 k $\Omega$ is provided for each channel to bias-control the diodes of the channel via the polycrystalline silicon resistor.

Figure 15:
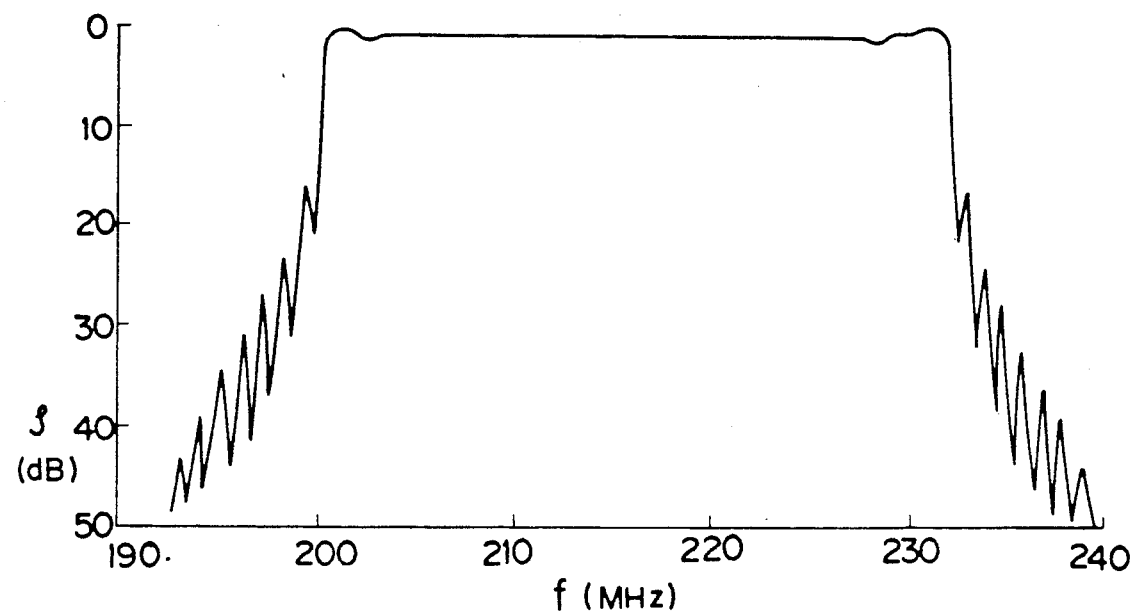
FIG. 15 shows the frequency characteristic as a notch filter.
Figure 16:
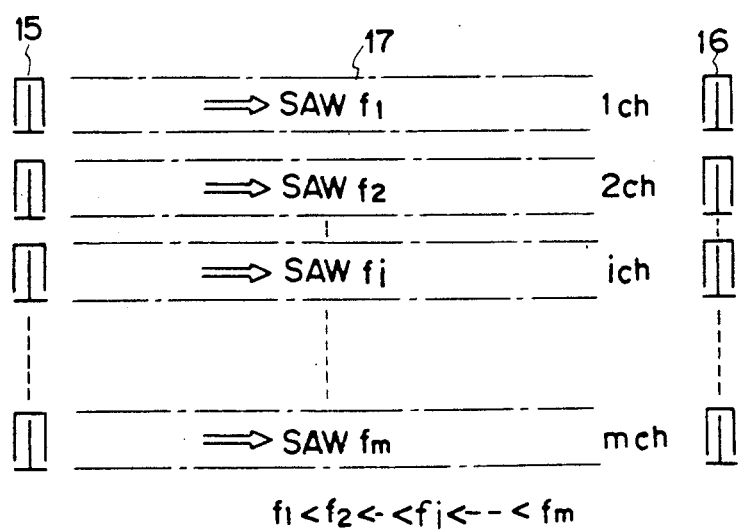
FIG. 16 is a schematic view showing relationships between frequencies and channels.

FIG. 15 is a graph of the relationship of insertion loss and frequency, and thus shows the essential band pass filtering characteristic of the filter. Since the input transducer consists of an array of transducers having different electrode periods, different frequency components travel in different portions of the propagation path. As shown in FIG. 16, the propagation path is divided into channels for different frequency components. As a result, even if the attenuation amount attendant upon propagation of a SAW is increased in a certain channel i alone, the attenuation occurs only to a signal of a frequency component f$_i$ in the channel i, and the other frequency components in the other channels are not affected. That is, a notch characteristic is added to the characteristic of FIG. 15.

The operation principle of the above-explained SAW element is based on two factors, i.e. the control of the SAW propagating loss caused by the bias control of the pn diode array provided on the propagating path and the adaptive control by the diode self bias produced upon entry of a large signal. These factors are explained below respectively.

Figure 17:
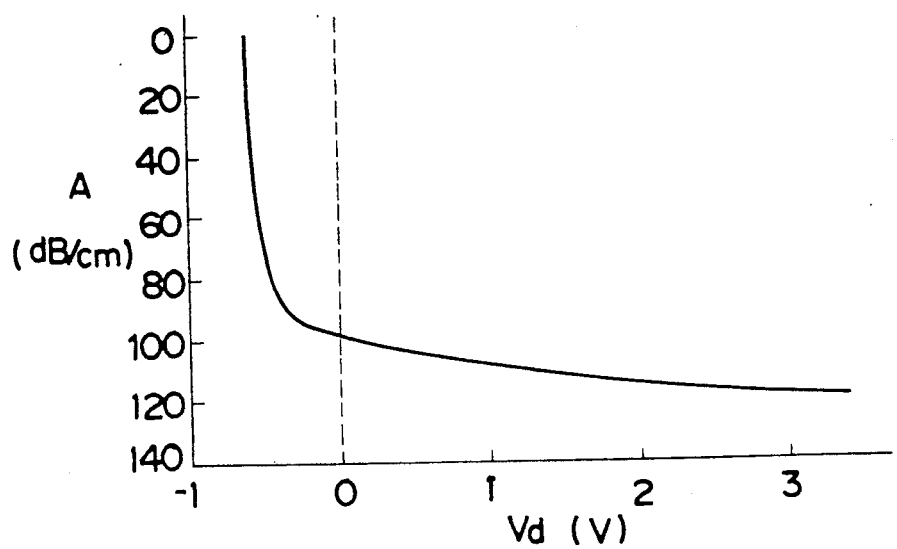
FIG. 17 is a graph showing the relationship between the diode d.c. bias voltage and the attenuation factor in the device of FIGS. 13(a) and 13(b)

(i) control of propagation path by diode bias:

When reviewing a single channel alone among the inventive element structure, the pn diode array is provided on the propagation path between the input and output transducers. FIG. 17 shows how the attenuation constant of the propagation path having thereon the pn diode array changes with the diode bias $V_d$.

The bias $V_g$ of the gate electrode on the ZnO piezoelectric layer is $V_g = -2$ V, the frequency is 215 MHz, and the Si surface is set in a slightly accumulated condition with respect the flat band. As shown in FIG. 17, by changing the diode bias $V_d$ from a forward bias to zero bias or a reverse bias, the attenuation amount A can be varied by 100 dB/cm or more.

Under a forward bias, electrons move from the n+ type impurity diffused region to the p type region, and positive holes move from the p+ type impurity diffused region to the p type region, so as to significantly increase the carrier density of the p type region. Therefore, the resistance ratio of the p type region is decreased, interaction between the SAW potential and the carrier is weakened, and the SAW attenuation amount is reduced.

Arrangement of the diode arrays is important, and a preferable gap between n-type impurity diffused regions is 0.5 $\mu$m to 10 $\mu$m approximately.

The thickness of the p-type Si epitaxial layer is more important. When the p-type Si epitaxial layer is thin, although the carrier density under a forward bias is increased, the attenuation amount under a reverse bias is small. In contrast, when the p-type Si epitaxial layer is thick, although the carrier density can be increased under a reverse bias, the increase of the carrier density under a forward bias is decelerated. The most preferable thickness is 5 $\mu$m to 15 $\mu$m.

Figure 18:
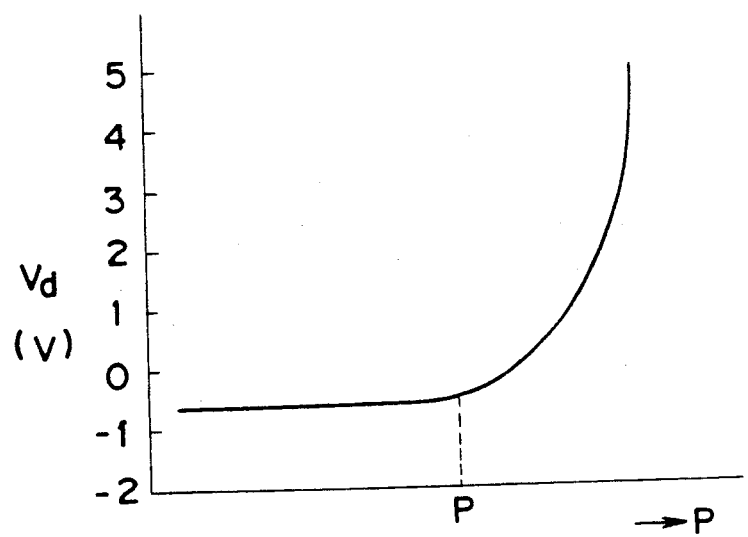
FIG. 18 is a graph showing the relationship between the SAW power in the propagation path and the bias voltage of the diode array in the device of FIGS. 13(a) and 13(b)

(ii) adaptive control of propagation path by diode self bias:

Take a single channel alone into consideration as in the aforegoing explanation. FIG. 18 shows the relationship between SAW power in the channel and bias voltage of the associated diode array. When the input signal power P is increased while forwardly biasing the pn diode array via the polycrystalline silicon resistor of about 1 k$\Omega$, the bias $V_d$ of the diode array is as shown in FIG. 18. Upon entry of a small power signal, no change occurs in the potential of the diode array. However, when a large power signal is entered, the bias of the diode array is shifted toward a reverse bias, under a threshold $P_o$(dBm) or more. The phenomenon is caused by generation of a self bias by a nonlinear resistance of the pn diodes.

When a large power SAW is present on the propagation path, the SAW potential modulates the potential of the pn diodes provided on the propagation path. Since a d.c. component is produced because of the nonlinearity of the current-voltage characteristic of the diodes, i.e. the nonlinear resistance, and since the d.c. component flows toward the power source through the resistance, the bias applied to the pn contact of the diode is shifted to a reverse bias.

This is the mechanism of generation of the self bias.

The operation theory of the adaptive notch filter will be readily understood from the aforegoing explanation of the two factors.

When the diode arrays of all the channels are set at forward biases, the input signal of the threshold level $P_o$ or less is outputted as a band pass filter output having the characteristic as shown in FIG. 15. When a high level signal (corresponding to a jamming or an interfering wave) corresponding to the frequency component of a certain channel i is entered, a high level SAW propagates in the corresponding channel alone, and a self bias shifts the bias of the diode arrays present in the channel to a reverse bias. Due to this bias shifting, the propagation loss of the propagating path of the channel i is increased by 100 dB/cm or more, and the high level signal is suppressed.

Thus the inventive filter operates well as an adaptive notch filter. In actual use of the filter in a system, an amplifier having an AGC (automatic gain control) function is provided in the preceding stage of the inventive filter to set a desired signal level at the threshold value.

Figure 19A:
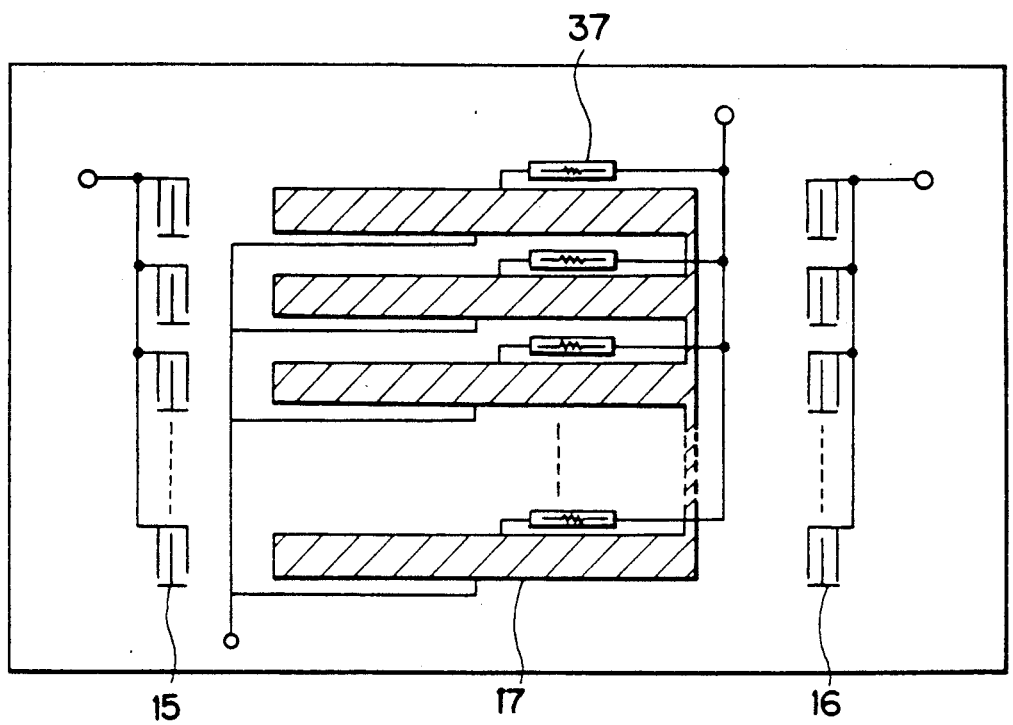
FIGS. 19(a) and 19(b) are upper and cross-sectional views of a SAW device taken as a still further embodiment of the invention.
Figure 19B:
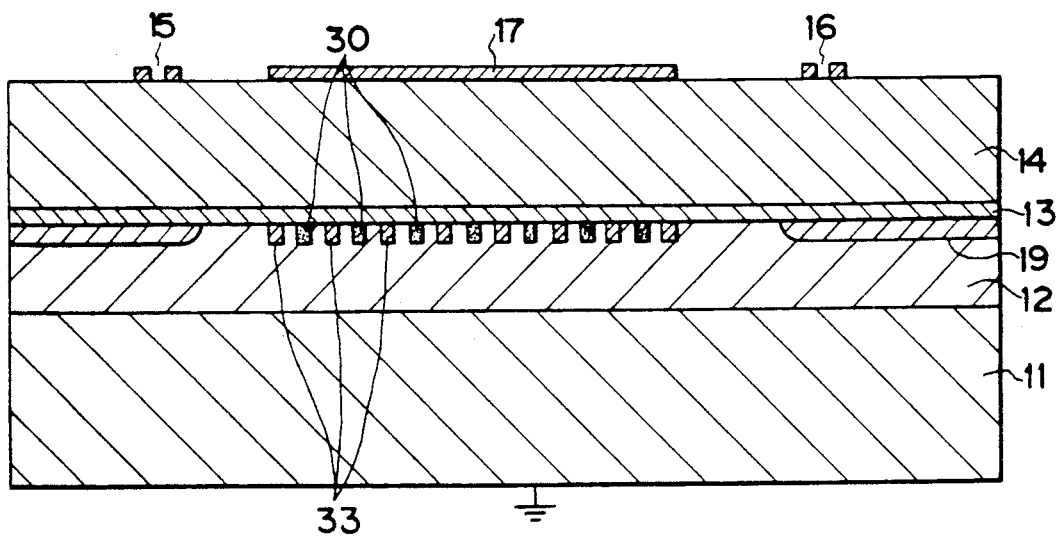
Figure 20:
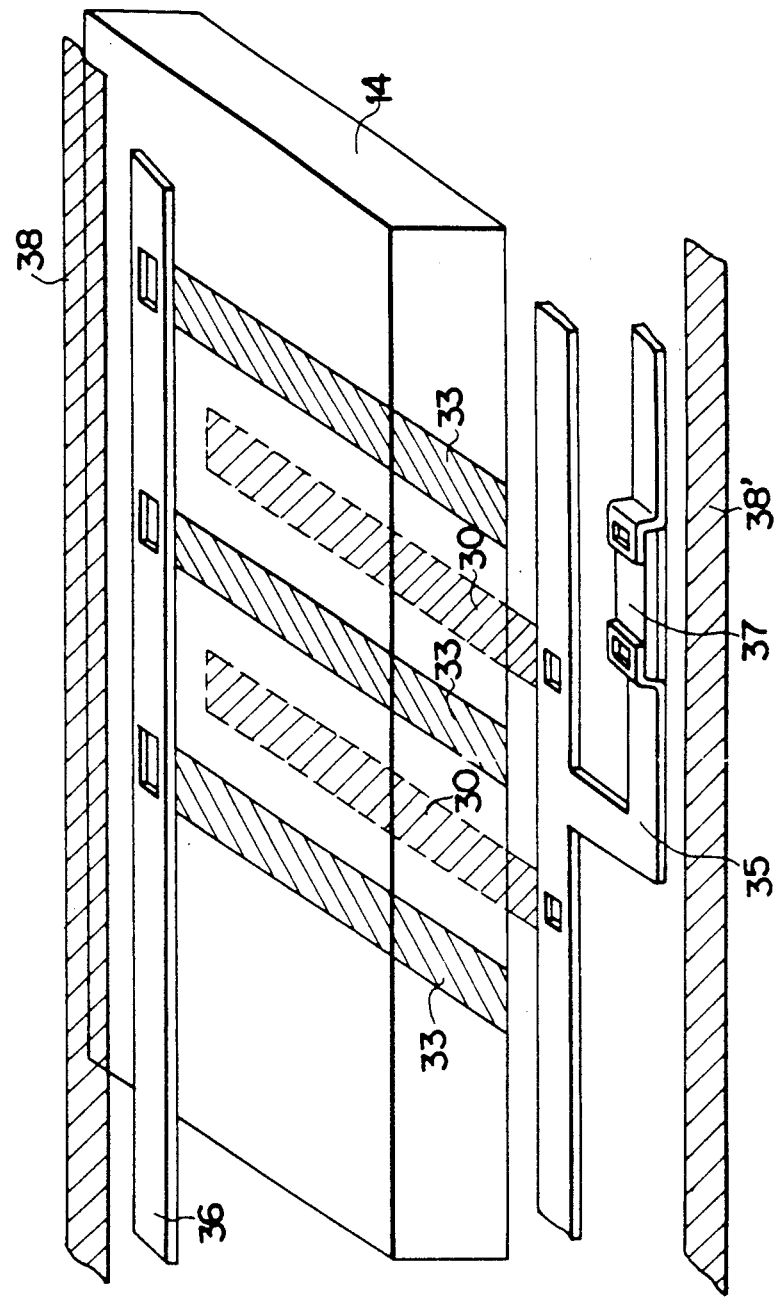
FIG. 20 is a detailed perspective view of a propagating portion of channel i in the device of FIGS. 19(a) and 19(b)

FIGS. 19 and 20 show a still further embodiment and correspond to FIG. 13 and FIG. 14, respectively.

Numeral 30 designates an array of n-type impurity diffused regions provided on the p(n) type Si epitaxial layer 12, and numeral 31 denotes a $p^+(n^+)$ diffused region. These regions 30 and 31 form an array of pn diodes.

FIG. 20 shows the propagation path of a single channel in a greater detail.

The n-type diffused region array 30 and an array of $p^+$-type diffused regions 33 are provided, one after the other, in the p-type Si epitaxial layer 12 under the ZnO piezoelectric layer 14, and are connected to metal lines 35 and 36, respectively. The metal line 35 connected to the n-type diffused regions 30 is connected to a polycrystalline silicon resistor 37. The metal lines 35 and 36, together with respective such metal lines of the other channels, are extended to respective power sources. Numerals 38 and 38' denote $p^+(n^+)$ channel stop diffused regions which behave as isolators for isolating the channel from the other channels. As shown in FIG. 20, the ZnO piezoelectric layer 14 exists in the propagating portion on the diode array of each channel, but it is removed from the side portion of the diode array.

The portion of the propagation path of the element of FIG. 19 consists of a plurality of unit arrangements of FIG. 20 in alignment.

The device having the above-described arrangement operates as explained below.

Figure 12D:
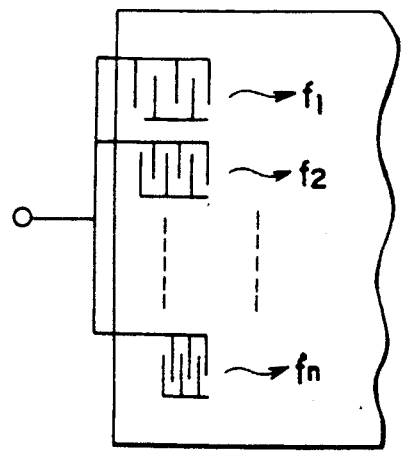

The input and output transducers are in the form of a filter bank including parallel connected transducers, having different electrode periods (corresponding to the wavelength of a SAW) (see FIG. 12(d)). Namely, they each consists of twenty-one (21) parallel-connected transducers of the electrode period of 22 $\mu$m to 26 $\mu$m. The number of electrode pairs of the input side is two hundred (200), and that of the output side is fifteen (15). The input transducer is in the form of a thinned-out structure in order to suppress secondary effects such as SAW reflection within the electrode. The interdigitating width of the transducers is 170 82 m.

The substrate is Si(110)-cut, and has a $p/p^+$ structure. The SAW propagating direction is [100]. The thickness of the p-type Si epitaxial layer is about 10 $\mu$m, and the impurity density is about $5.0 \times 10^{-3}$.

The Si thermal oxide layer is about 100 nm thick, and the ZnO piezoelectric layer is about 5.0 $\mu$m thick. A P-doped n-type impurity region and a high-density B-doped $p^+$-type diffused region are provided on the surface of the p-type Si epitaxial layer to form pn diodes, and respective channels are separated by channel stops in the form of B-doped $p^+$ diffused regions. The transducers on the ZnO layer, gate and diode bias control lines are made from Al. A polycrystalline resistor of about 1 k$\Omega$ is provided for each channel.

The diode bias control metal lines consists of two groups. Diode bias control metal lines in one group are connected to the n-type impurity region via the polycrystalline Si resistor of 1 k$\Omega$ while those in the other group are connected to the $p^+$-type diffused region. The pn diodes are of two types; those of one type are formed between the n-type impurity diffused region and the p-type Si epitaxial layer while those of the other type are formed between the p-type Si epitaxial layer and the n-type substrate. The invention uses the former type pn diodes. The pn diodes between the $n^+$-type diffused region and the p-type epitaxial layer are biased via the polycrystalline Si resistor.

Figure 21:
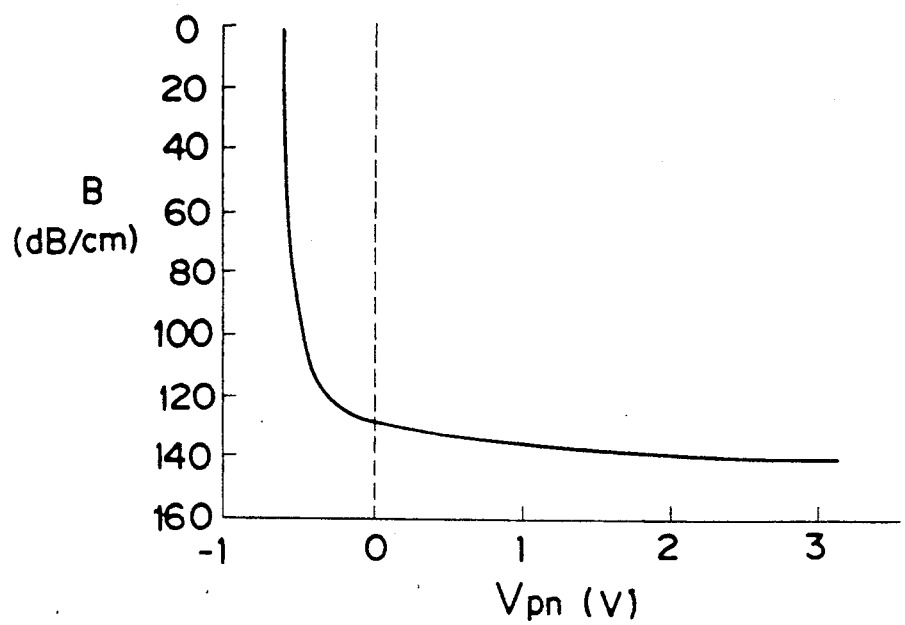
FIG. 21 is a graph showing the relationship between the pn junction voltage and the attenuation coefficient in the device of FIGS. 19(a) and 19(b)
Figure 22:
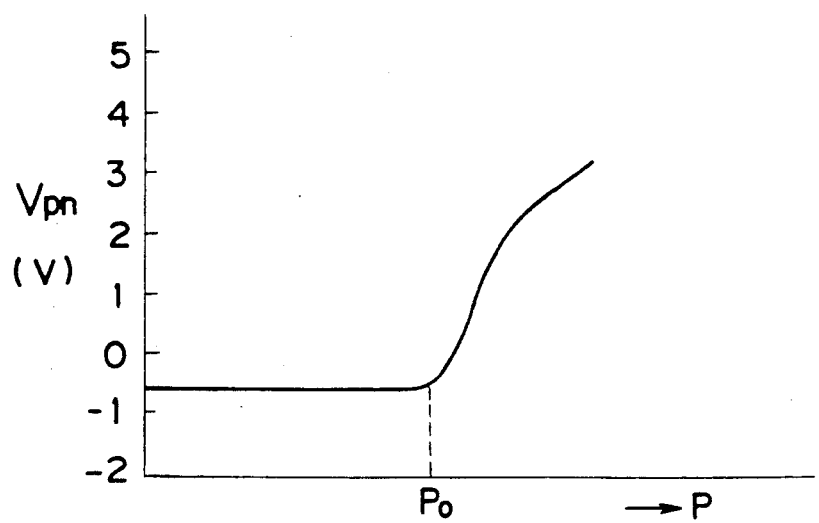
FIG. 22 is a graph showing the relationship between the SAW power in the propagation path and the pn junction voltage.

The device of FIGS. 19 and 20 operates in the substantially same manner qualitatively as the device of FIGS. 13 and 14. FIG. 21 shows changes in the attenuation constant B of the propagation path with the diode (bias) $V_d$ when the gate bias is $-2$ V, and FIG. 22 shows the relationship between the pn contact voltage $V_{pn}$ and the SAW power p in the propagation path. It is recognized that the embodiment of FIGS. 19 and 20 permits a larger variation of the attenuation amount and minimizes the loss during a forward bias, as compared to the former embodiment.

The embodiment of FIGS. 19 and 20 is an improved version of the former embodiment, and can increase the thickness of the p-type Si epitaxial layer in order to establish a larger SAW attenuation amount. The carrier density under a forward bias can be increased to improve the efficiency, regardless of the thickness of the epitaxial layer, by decreasing the distance between the $p^{30}$ and $n^+$ impurity diffused regions of the diode arrays provided on the silicon surface.

Although the embodiment is explained above as using the p/n-arranged Si substrate, the Si substrate may be a p-type single-crystal substrate or may be in the form of p/p/arrangement.

FIGS. 23 through 32 are shown to explain, in particular, embodiments corresponding to claims 15 through 21.

Figure 23:
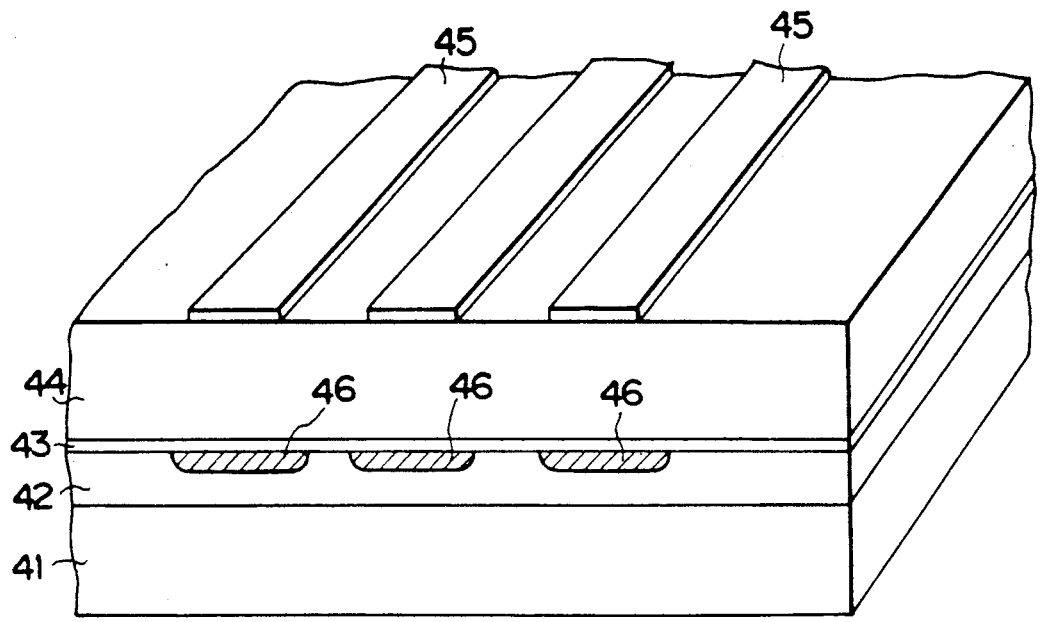
FIG. 23 is a schematic view of a transducer arrangement taken as a yet further embodiment of the invention.

FIG. 23 is a schematic view of a surface-acoustic-wave transducer portion taken as one of the said embodiments.

In the same drawing, reference numeral 41 refers to a $p^+(n^+)$ Si single-crystal substrate, 42 to a p(n)-type Si epitaxial layer provided on the substrate, 43 to a thermal oxide layer provided on the Si epitaxial layer, 44 to a ZnO piezoelectric layer provided on the thermal oxide layer, and 45 to a metal electrode provided on the piezoelectric layer to behave as a comb-shaped transducer for surface acoustic waves. Numeral 46 denotes n(p)-type impurity diffused regions provided in the p(n)-type Si epitaxial layer 42 under the transducer metal electrodes to form arrays of pn diodes under the transducer metal electrodes.

Figure 24A:
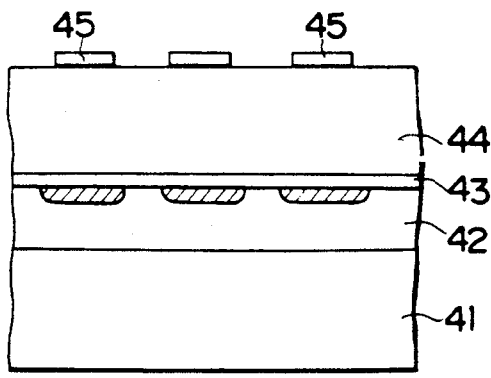
FIGS. 24(a) and 24(b) are cross-sectional views of a transducer portion.
Figure 24B:
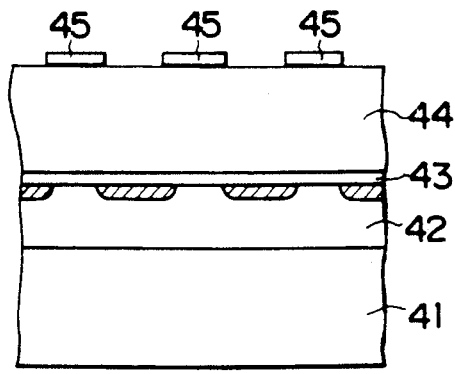

The n(p)-type impurity diffused regions 46 are arranged with the same pitch as that of the transducer metal electrodes 45, and are provided just under the metal electrodes in a version of FIG. 24(a) or under spaces between the metal electrodes in a version of FIG. 24(b).

In the arrangements of FIGS. 23, 24(a) and 24(b), the substrate 41 has the grounded potential, and a d.c. bias is applied to the n(p)-type impurity diffused regions. Another d.c. bias may be applied to the transducer 45, as well, to increase an effect which will be explained later. An RF input or output signal is entered in or outputted from the transducer metal electrodes 45.

Figure 25:
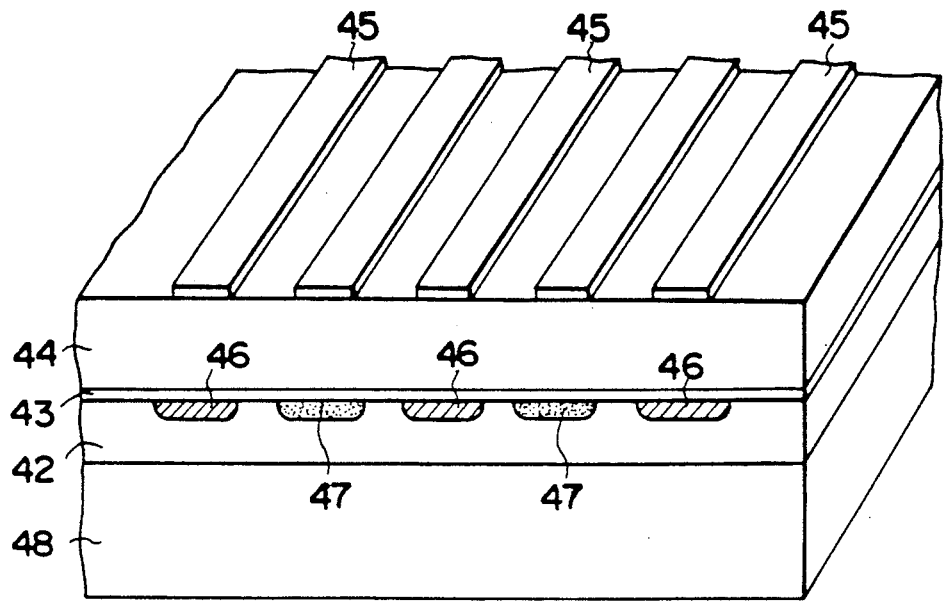
FIG. 25 is a schematic view of a transducer arrangement taken as a yet further embodiment of the invention.
Figure 26A:
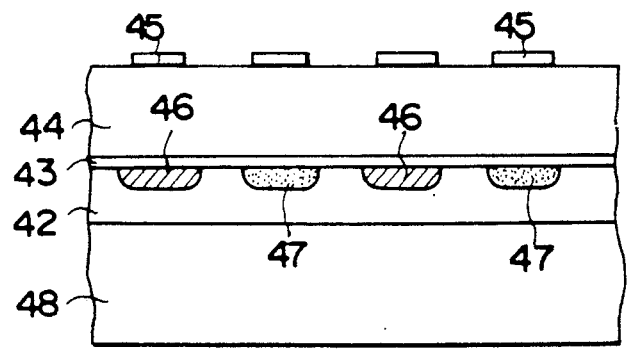
FIGS. 26(a) and 26(b) are cross-sectional views of a transducer portion.
Figure 26B:
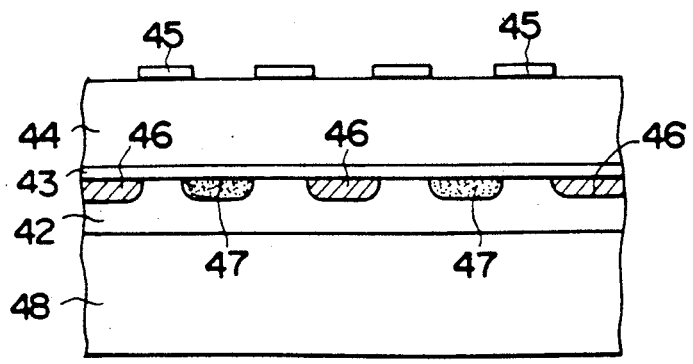

FIGS. 25, 26(a) and 26(b) show a transducer having identical functions as the preceding embodiment except that it uses an n-type or p-type single-crystal substrate as the silicon single-crystal substrate 48 and that the n(p)-type impurity diffused regions 46 and p+(n+) impurity diffused regions 47 are provided, one after the other, in the p(n)-type Si epitaxial layer 42. This embodiment also includes pn diode arrays under the metal electrodes of the transducer. In this arrangement, a d.c. bias is applied between the p+(n+) impurity diffused regions 47 and the n(p)-type impurity diffused regions 46 provided along the surface of the p(n)-type Si epitaxial layer 42 to control the pn diode arrays under the transducers 45.

Figure 27:
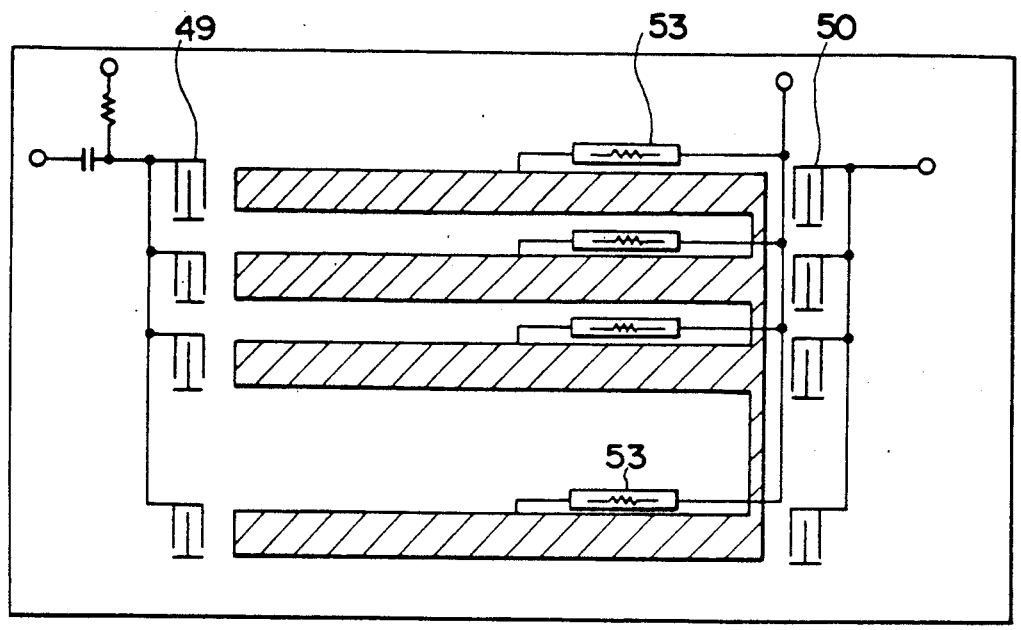
FIG. 27 is a plan view of a SAW device taken as a first embodiment.
Figure 28:
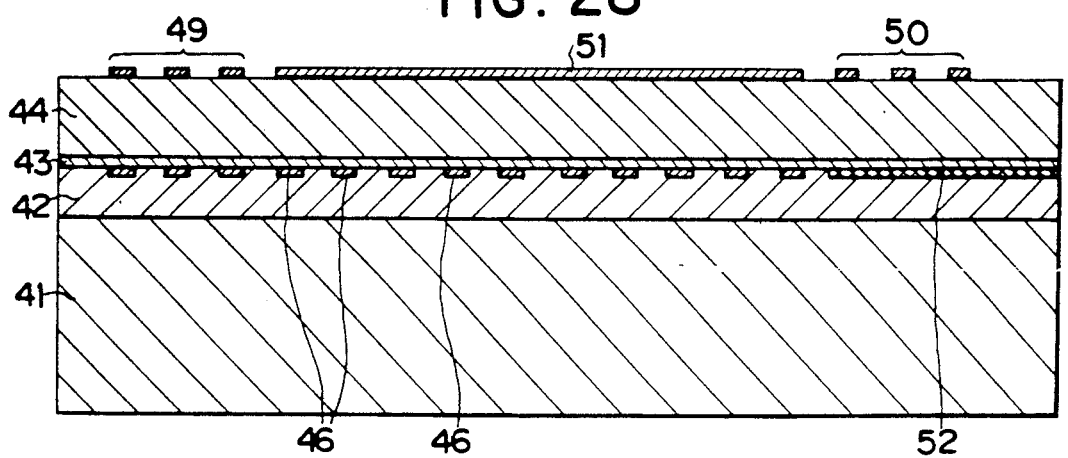
FIG. 28 is a cross-sectional view of the device of FIG. 27.
Figure 29:
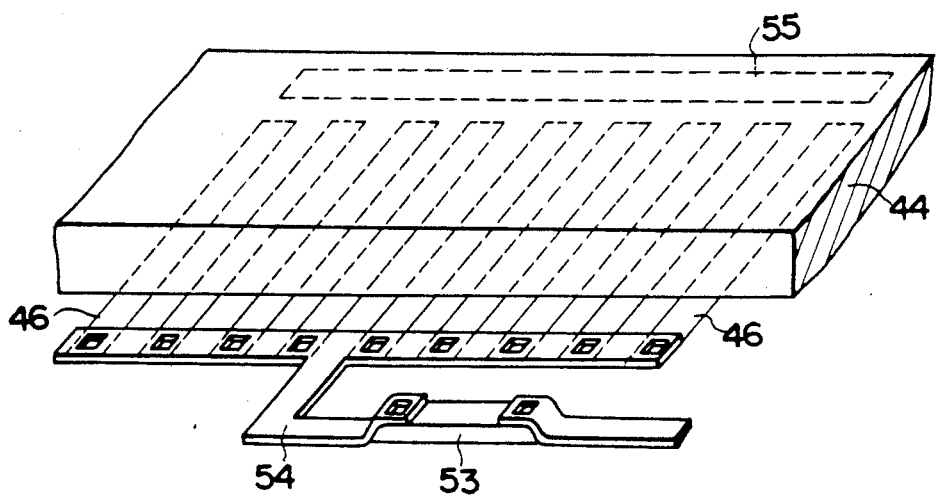
FIG. 29 is a detailed perspective view of a channel propagating portion.

Particular examples of element structures using the transducer arrangement of FIG. 23 are shown in FIGS. 27, 28 and 29.

In FIGS. 27 and 28, reference numeral 49 refers to an array of input transducers, 50 to an array of output transducers, 51 to a gate electrode, 52 to a p+(n+) impurity diffused region, and 53 to polysilicon resistors.

The propagation path of the element of FIGS. 27 and 28 consists of multiple aligned units of the arrangement of FIG. 29. More specifically, the n(p)-type impurity diffused regions 46 (diode array) are connected to a metal line 54 provided on the surface of the silicon oxide layer 43 under the ZnO piezoelectric layer 44, the metal line 54 is connected to the polysilicon resistor 53, and such metal lines from all the channels are connected together to a d.c. bias source. Numeral 55 denotes a channel stop made by diffusing a p+(n+) impurity to behave as an isolator for isolating the channel from the other channels. The ZnO piezoelectric layer 44 is partly removed by etching undesired portions other than the SAW propagation path of each channel.

Figure 30:
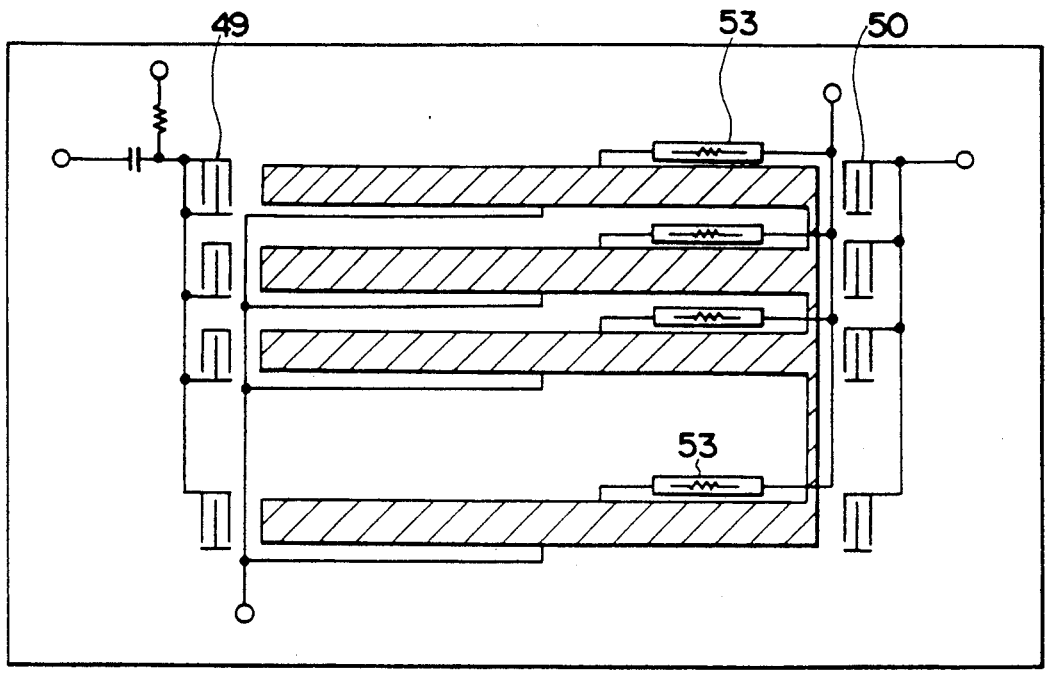
FIG. 30 is a plan view of a SAW device taken as a yet further embodiment.
Figure 31:
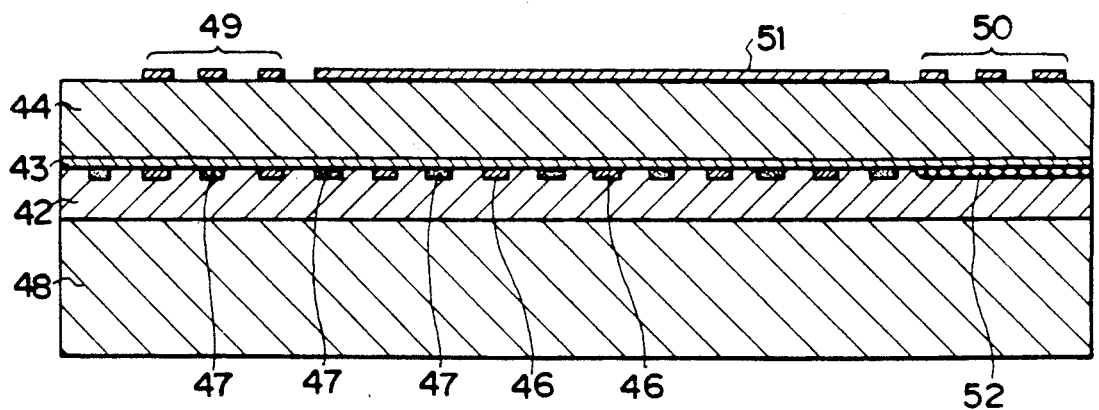
FIG. 31 is a cross-sectional view of the device of FIG. 30.
Figure 32:
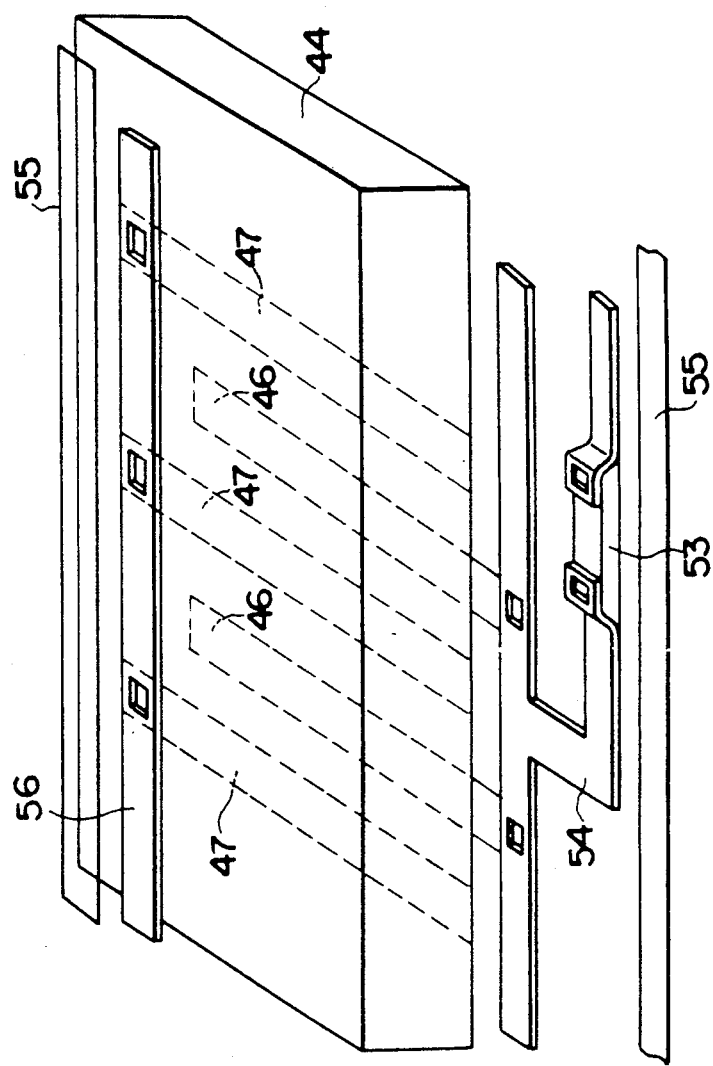
FIG. 32 is a detailed perspective view of a channel propagating portion.

Particular examples of element structures using a third transducer arrangement are shown in FIGS. 30, 31 and 32. Among respective elements or members shown in these drawings, the same elements as those of FIGS. 27 to 29 are not explained here. Reference numeral 56 (FIG. 32) denotes a channel stop made by diffusing a p+(n+) impurity to behave as an isolator for isolating the channel from the other channels.

The transducer according to the embodiment of FIGS. 23, 24(a) and 24(b) operates as explained below.

Assume here that the Si substrate is Si(100)-cut, and the SAW propagating direction is equivalent to Si[100]. The high-resistance silicon epitaxial layer 42 formed on the substrate is as thick as 20 μm. The electrode period of the transducer (corresponding to the wavelength of a SAW) is 24 μm, and the thickness of the ZnO piezoelectric layer 44 is 5 μm.

Heretofore, in order to increase the practical conversion efficiency of the transducer, a high-density impurity-doped low-resistance silicon layer is provided in the epitaxial layer throughout the area under the transducer, and the practical coupling coefficient is about 6% or 3% according to the presence or absence of the low-resistance silicon layer. In contrast, according to the embodiment of FIGS. 24(a) and 24(b) where the impurity diffused regions 46 and 47 are provided under the transducer electrodes under appropriate selection of their positions, dimension and the impurity density, the coupling coefficient can be varied between 6% and 3% by controlling the bias of the pn diodes.

In particular, the diodes are forward-biased, carriers move from the n+(p+)-type impurity diffused regions and from the p+(n+) regions of the substrate to the epitaxial layer, the carrier density of the epitaxial layer is increased at portions near the impurity diffused regions, the resistance ratio of the epitaxial layer is decreased, causing an increase of the coupling coefficient. In contrast, when using a reverse bias, a coupling coefficient defined by positioning, dimension, impurity density and other structural parameters is obtained.

The transducer of FIGS. 25 and 26 operates in the same manner as the aforeexplained transducer except its biasing process.

In the transducers of FIGS. 23 to 24 and 25 to 26, a d.c. bias may be applied to the metal electrodes 45 as well. When using the above-described operation theory, a bias is preferably applied so as to change the Si surface condition of the epitaxial layer to a flatband or a depletion layer in the MOS structure.

It is possible for the transducers according to FIGS. 23 to 26 to have further important functions.

More specifically, the SAW attenuation coefficient in the transducer can be controlled by controlling the bias of the diode array under the metal electrodes of the transducer. For example, by biasing them forwardly, the attenuation attendant on propagation of a SAW in the transducer is minimized, and by zero or reverse-biasing them, attenuation of 100 dB/cm or more is established. Also in this case, it is preferred to apply a d.c. bias to the metal electrodes of the transducer so that the Si surface condition of the epitaxial layer approaches the flat band.

As explained above, when the transducer of the arrangement of FIGS. 23 to 26 as is, for example, an input transducer, the practical transform efficiency is held at a maximum value by biasing the pn diode array forwardly, the attenuation attendant on SAW propagation is minimized, and it operates as an excellent SAW transducer.

By zero- or reverse biasing the pn diode array, the transform efficiency is decreased due to a decrease in the coupling coefficient, and the converted SAW is attenuated in the transducer so that it does not reach the output transducer.

Thus by bias controls of the pn diodes, a bandpass filter variable in the insertion loss is established. In this case, however, a sufficient effect is not expected unless the transducer has a large number of pairs of electrodes.

Further, by biasing the pn diodes under the transducer via the polysilicon resistor as described above, the device can behave as an adaptive filter which operates as a normal bandpass filter upon entry of a small signal but, upon entry of a large power signal, largely attenuates the signal.

Although the diode array is biased forwardly via the polysilicon resistor, a self bias is produced in the diode array when a large signal is inputted, and the bias is shifted to a forward bias to a reverse bias. This bias shift causes an adaptive decrease of the conversion efficiency or an adaptive increase of the attenuation factor. FIGS. 27 to 29 and FIGS. 30 to 32 show elements which use the aforementioned principle and use a parallel connection of a lot of bandpass filters (filter band arrangement) to establish an adaptive notch filter system. These arrangements are particularly effective because of their long transducer.

As described above, the notch filter using the inventive SAW device has the following merits:

(i) Since the notch characteristic is controlled by bias controls of the diodes, the response time is very short, unlike gate bias controls.

(ii) A large notch depth is obtained in relatively narrow bands.

(iii) Since the diodes are controlled by d.c. bias controls, the arrangement of the diode control circuit is simplified.

iv) The device structure is relatively simple, and the productivity is good.

What is claimed is:

1. A surface-acoustic-wave device comprising:
a first conduction type semiconductor layer;
a piezoelectric layer provided on said first conduction type semiconductor layer;
an input transducer and an output transducer provided on said piezoelectric layer in a direction across a traveling direction of a surface acoustic wave and each transducer having a plurality of different electrode periods;
a gate electrode provided on said piezoelectric layer between said input and output transducers; and
diode means provided in said first conduction type semiconductor layer under said gate electrode
wherein said first conduction type semiconductor layer includes a first conduction type semiconductor substrate having a high impurity density and a first conduction type epitaxial layer provided on said substrate;
wherein said diode means includes multiple arrays of diodes, said arrays each extending substantially parallel to said traveling direction;
further comprising a plurality of metal lines provided on said first conduction type epitaxial layer to control respective said diode arrays.

2. A surface-acoustic-wave device comprising:
a first conduction type semiconductor layer;
a piezoelectric layer provided on said first conduction type semiconductor layer;
an input transducer and an output transducer provided on said piezoelectric layer in a direction across a traveling direction of a surface acoustic wave and each transducer having a plurality of different electrode periods;
a gate electrode provided on said piezoelectric layer between said input and output transducers; and
diode means provided in said first conduction type semiconductor layer under said gate electrode;
wherein said diode means includes multiple arrays of diodes, said arrays each extending substantially parallel to said traveling direction.

3. The surface-acoustic-wave device according to claim 2, wherein said first conduction type semiconductor layer includes a first conduction type semiconductor substrate having a high impurity density and a first conduction type epitaxial layer provided on said substrate.

4. The surface-acoustic-wave device according to claim 3, further comprising first conduction type regions having a high impurity density provided in selected portions of said first conduction type epitaxial layer under said input and output transducers.

5. The surface-acoustic-wave device according to claim 2, wherein each said diode array includes a plurality of pn diodes in the form of second conduction type high-density impurity diffused regions disposed at respective locations along said travelling direction.

6. A surface-acoustic-wave device comprising:
a first conduction type semiconductor layer;
a piezoelectric layer provided on said first conduction type semiconductor layer;
an input transducer and an output transducer provided on said piezoelectric layer in a direction across a traveling direction of a surface acoustic wave and each transducer having a plurality of different electrode periods;
a gate electrode provided on said piezoelectric layer between said input and output transducers; and
diode means provided in said first conduction type semiconductor layer under said gate electrode;
wherein said first conduction type semiconductor layer includes a first conduction type semiconductor substrate having a high impurity density and a first conduction type epitaxial layer provided on said substrate;
wherein said diode means includes multiple arrays of diodes, said array extending substantially parallel to said traveling direction; and
further comprising channel stop diffused regions having a high first conduction type impurity density which are provided in said first conduction type epitaxial layer on opposite side of each said diode array.

7. A surface-acoustic-wave device comprising:
a first conduction type semiconductor layer;
a piezoelectric layer provided on said first conduction type semiconductor layer;
an input transducer and an output transducer provided on said piezoelectric layer in a direction across a traveling direction of a surface acoustic wave and each transducer having a plurality of different electrode periods;
a gate electrode provided on said piezoelectric layer between said input and output transducers; and
diode means provided in said first conduction type semiconductor layer under said gate electrode;
wherein said first conduction type semiconductor layer includes a first conduction type semiconductor substrate having a high impurity density and a first conduction type epitaxial layer provided on said substrate;
wherein said diode means includes multiple arrays of diodes, said array extending substantially parallel to said traveling direction;
each said diode array includes a plurality of pn diodes in the form of second conduction type high-density impurity diffused regions disposed at respective locations along said traveling direction; and
further comprising a plurality of metal lines provided on said first conduction type epitaxial layer to control respective said diode arrays.

8. A surface-acoustic-wave notch filter comprising:
(a) a first conduction type semiconductor substrate having a high impurity density;
(b) a first conduction type epitaxial layer provided on said semiconductor substrate;
(c) an insulating layer provided on said epitaxial layer;
(d) a piezoelectric layer provided on said insulating layer;
(e) an input transducer and an output transducer provided on said piezoelectric layer in a direction across a traveling direction of a surface acoustic wave and each transducer having a plurality of different electrode periods, and a gate electrode provided on said piezoelectric layer between said transducers;
(f) arrays of pn diodes provided in said first conduction type epitaxial layer under said gate electrode, each said diode array extending in a direction along said traveling direction and including a plurality of second conduction type high-density impurity diffused regions which are connected and are disposed at respective locations along said traveling direction;

(g) a plurality of metal lines provided on said first conduction type epitaxial layer to control respective said diode arrays; and (h) a control circuit for selectively applying a predetermined bias to each of said metal lines.

9. A surface-acoustic-wave device comprising:
(a) a first conduction type semiconductor layer;
(b) a piezoelectric layer provided above said semiconductor layer;
(c) an input transducer provided on said piezoelectric layer to produce from an input signal a plurality of surface acoustic wave signals which travel in a traveling direction along respective traveling paths spaced from each other in a direction transverse to said traveling direction;
(d) an output transducer provided on said piezoelectric layer to combine said plurality of surface acoustic wave signals from said respective traveling paths into an output signal;
(e) arrays of diodes provided along respective said surface acoustic wave traveling paths on said semiconductor layer, each said diode array being in the form of a second conduction type diffused layer having respective portions disposed at spaced locations along the surface acoustic wave traveling path; and
(f) gate electrodes provided on said piezoelectric layer along respective said traveling paths extending between said input and output transducers and supplied with a bias voltage;
wherein said diode arrays provided in respective said surface acoustic wave traveling paths are supplied with bias voltages via respective independent resistors.

10. A surface-acoustic-wave device comprising:
a first conduction type semiconductor layer;
a piezoelectric layer provided above said semiconductor layer;
an input transducer provided on said piezoelectric layer to produce from an input signal a plurality of surface acoustic wave signals which travel in a traveling direction along respective traveling paths spaced from each other in a direction transverse to said traveling direction;
an output transducer provided on said piezoelectric layer to combine said plurality of surface acoustic wave signals from said respective traveling paths into an output signal;
arrays of didoes provided along respective said surface acoustic wave traveling paths on said semiconductor layer, each said diode array being in the form of a second conduction type diffused layer having respective portions disposed at spaced locations along the surface acoustic wave traveling path; and
gate electrodes provided along respective said traveling paths extending between said input and output transducers on said piezoelectric layer and supplied with a bias voltage;
wherein said diode arrays provided in respective said surface acoustic wave traveling paths are supplied with bias voltage via respective independent resistors, wherein said first conduction type semiconductor layer is provided on a first conduction type semiconductor substrate having a high impurity density, including an insulating layer on said first conduction type semiconductor layer, wherein said piezoelectric layer is provided on said insulating layer, and wherein said resistors which are used for applying said bias voltages to said diode arrays are made from polycrystalline silicon provided on said insulating layer.

11. A surface-acoustic-wave device comprising:
(a) a first conduction type semiconductor layer;
(b) a piezoelectric layer provided above said semiconductor layer;
(c) an input transducer provided on said piezoelectric layer to produce from an input signal a plurality of surface acoustic wave signals which travel in a traveling direction along respective traveling paths spaced from each other in a direction substantially normal to said traveling direction;
(d) an output transducer provided on said piezoelectric layer to combine said plurality of surface acoustic wave signals from said respective traveling paths into an output signal;
(e) arrays of second conduction type impurity diffused regions provided with a predetermined pitch on respective said surface acoustic wave traveling paths on said semiconductor layer;
(f) arrays of first conduction type impurity diffused regions provided with substantially said predetermined pitch on respective said surface acoustic wave traveling paths on said semiconductor layer and sandwiched by said second conduction type impurity diffused regions and
(f) gate electrodes provided along respective said traveling paths extending between said input and output transducers on said piezoelectric layer and supplied with a bias voltage.

12. The surface-acoustic-wave device according to claim 11 wherein said first conduction type semiconductor layer is provided on a second conduction type semiconductor substrate, including an insulating layer on said first conduction type semiconductor layer, wherein said piezoelectric layer is provided on said insulating layer, and including resistors which are used for applying bias voltages to the respective first and second conduction type arrays and are made from polycrystalline silicon provided on said insulating layer.

13. The surface-acoustic-wave device according to claim 11 wherein said first conduction type semiconductor layer is provided on a first conduction type semiconductor substrate, including an insulating layer on said first conduction type semiconductor layer, wherein said piezoelectric layer is provided on said insulating layer, and including resistors which are used for applying bias voltages to the respective first and second conduction type arrays and are made from polycrystalline silicon provided on said insulating layer.

14. A surface-acoustic-wave device comprising:
a first conduction type semiconductor layer;
a piezoelectric layer provided on said first conduction type semiconductor layer;
an input transducer and an output transducer provided on said piezoelectric layer in a direction across a traveling direction of a surface acoustic wave and each transducer having a plurality of different electrode periods;
a gate electrode provided on said piezoelectric layer between said input and output transducers; and
diode means provided in said first conduction type semiconductor layer under said gate electrode;

wherein said diode means extend to said first conduction type semiconductor layer under said input and output transducers.

15. The surface-acoustic-wave device according to claim 14, wherein said transducers include metal electrodes spaced with a predetermined pitch, and wherein said diode means are in the form of arrays which have elements spaced by said pitch and which are provided under respective said metal electrodes of said transducers.

16. The surface-acoustic-wave device according to claim 14, wherein said transducers include metal electrodes spaced with a predetermined pitch, and wherein said diode means are in the form of arrays which have elements spaced by said pitch and which are provided under respective portions between said metal electrodes of said transducers.

17. The surface-acoustic-wave device according to claim 14 wherein said diode arrays are biased by a d.c. source via resistors.

18. The surface-acoustic-wave device according to claim 17 wherein said resistors are polysilicon resistors provided on a single semiconductor substrate.

19. The surface-acoustic-wave device according to claim 17 wherein said resistors are polysilicon resistors provided in said first conduction type semiconductor layer.

20. A surface-acoustic-wave device comprising:
a first conduction type semiconductor layer;
a piezoelectric layer provided on said first conduction type semiconductor layer;
an input transducer and an output transducer provided on said piezoelectric layer in a direction across a traveling direction of a surface acoustic wave and each transducer having a plurality of different electrode periods;
a gate electrode provided on said piezoelectric layer between said input and output transducers; and
diode means provided in said first conduction type semiconductor layer under said gate electrode;
wherein said diode means includes multiple arrays of diodes, said arrays each extending substantially parallel to said traveling direction; and
wherein said diode arrays extend to said first conduction type semiconductor layer under said input transducer.

21. The surface-acoustic-wave device according to claim 20 wherein said diode arrays are biased by a common source via respective resistors.

22. A surface-acoustic-wave device comprising:
(a) a first conduction type semiconductor layer;
(b) a piezoelectric layer provided above said semiconductor layer;
(c) an input transducer provided on said piezoelectric layer to produce from an input signal a plurality of surface acoustic wave signals which travel in a traveling direction along respective traveling paths spaced from each other in a direction substantially normal to said traveling direction;
(d) an output transducer provided on said piezoelectric layer to combine said plurality of surface acoustic wave signals from said respective traveling paths into an output signal;
(e) arrays of second conduction type impurity diffused regions provided with a predetermined pitch on respective said surface acoustic wave traveling paths on said semiconductor layer;
(f) arrays of first conduction type high-density impurity diffused regions provided with substantially the same pitch as said predetermined pitch on respective said surface wave traveling paths on said semiconductor layer sandwiched by said second conduction type impurity diffused regions;
(f) gate electrodes provided in respective said traveling paths extending between said input and output transducers on said piezoelectric layer and supplied with a bias voltage;
(h) first control lines connecting respective ends of said first conduction type high-density impurity diffused regions provided on respective said surface acoustic wave traveling paths to hold them at a certain reference potential; and
(i) second control lines connecting respective ends of said second conduction type impurity diffused regions provided on respective said surface acoustic wave traveling paths to connect them to a power source via independent resistors for respective said traveling paths.

23. The surface-acoustic-wave device according to claim 22 wherein said first conduction type semiconductor layer is provided on a first conduction type semiconductor substrate, including an insulating layer on said first conduction type semiconductor layer, wherein said piezoelectric layer is provided on said insulating layer, and including resistors which are used for applying bias voltages to the respective first and second conduction type arrays and are made from polycrystalline silicon provided on said insulating layer.

24. The surface-acoustic-wave device according to claim 22 wherein said first conduction type semiconductor layer is provided on a second conduction type semiconductor substrate, including an insulating layer on said first conduction type semiconductor layer, wherein said piezoelectric layer is provided on said insulating layer, and including resistors which are used for applying bias voltages to the respective first and second conduction type arrays and are made from polycrystalline silicon provided on said insulating layer.

* * * * *